(12) United States Patent
Yamazaki et al.

(10) Patent No.: US 10,062,319 B2
(45) Date of Patent: Aug. 28, 2018

(54) DISPLAY DEVICE

(71) Applicant: Semiconductor Energy Laboratory Co., Ltd., Atsugi-shi, Kanagawa-ken (JP)

(72) Inventors: Shunpei Yamazaki, Tokyo (JP); Hajime Kimura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/497,344

(22) Filed: Apr. 26, 2017

(65) Prior Publication Data

US 2017/0229063 A1 Aug. 10, 2017

Related U.S. Application Data

(63) Continuation of application No. 14/223,107, filed on Mar. 24, 2014, now Pat. No. 9,640,104.

(30) Foreign Application Priority Data

Mar. 28, 2013 (JP) .................................. 2013-069385

(51) Int. Cl.
*G09G 5/00* (2006.01)
*G09G 3/32* (2016.01)
(Continued)

(52) U.S. Cl.
CPC .......... *G09G 3/32* (2013.01); *H01L 27/1225* (2013.01); *H01L 29/7869* (2013.01);
(Continued)

(58) Field of Classification Search
CPC ......... G09G 2330/02; G09G 2330/021; G09G 3/32; G09G 3/36; G09G 3/3655
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Amano.S et al., "Low Power LC Display Using In—Ga—Zn-Oxide TFTs Based on Variable Frame Frequency", SID Digest '10 : SID International Symposium Digest of Technical Papers, 2010, vol. 41, pp. 626-629.
(Continued)

*Primary Examiner* — Jennifer Nguyen
(74) *Attorney, Agent, or Firm* — Fish & Richardson P.C.

(57) ABSTRACT

To reduce power consumption of a display device. A sequence of supply of video signals to a plurality of pixels included in an active matrix display device is controlled. For example, a supply sequence is controlled so that the potentials of the video signals supplied to a plurality of pixels are in ascending order or in descending order. This enables a reduction in the amount of charge and discharge of electric charge of signal lines which supply video signals to a plurality of pixels. Consequently, power consumption of the display device can be reduced.

10 Claims, 14 Drawing Sheets

(51) Int. Cl.
*H01L 27/12* (2006.01)
*H01L 29/786* (2006.01)

(52) U.S. Cl.
CPC . *G09G 2300/08* (2013.01); *G09G 2310/0213* (2013.01); *G09G 2310/08* (2013.01); *G09G 2330/021* (2013.01); *G09G 2352/00* (2013.01); *G09G 2360/18* (2013.01)

(58) Field of Classification Search
USPC .................... 345/76–100, 211–213, 690, 204
See application file for complete search history.

(56) References Cited

U.S. PATENT DOCUMENTS

| | | | |
|---|---|---|---|
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,616,222 | B2 | 11/2009 | Chuang et al. |
| 7,674,650 | B2 | 3/2010 | Akimoto et al. |
| 7,732,819 | B2 | 6/2010 | Akimoto et al. |
| 8,866,725 | B2 | 10/2014 | Yamazaki et al. |
| 9,640,104 | B2* | 5/2017 | Yamazaki ............ G09G 3/2007 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0122809 | A1* | 7/2003 | Sakamaki ............ G09G 3/3611 345/204 |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0016633 | A1* | 1/2009 | Miyasaka ............ G09G 3/2007 382/255 |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2009/0284502 | A1* | 11/2009 | Hayafuji ............ G09G 3/2025 345/205 |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0090183 | A1 | 4/2011 | Yamazaki et al. |
| 2011/0090204 | A1 | 4/2011 | Yamazaki et al. |
| 2011/0149185 | A1 | 6/2011 | Yamazaki |
| 2012/0032942 | A1* | 2/2012 | Toyotaka .................. G09G 3/20 345/212 |
| 2014/0375622 | A1* | 12/2014 | Nakagawa ............ G09G 3/3614 345/212 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2000-163001 A | 6/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-077634 A | 3/2005 |
| JP | 2006-301651 A | 11/2006 |
| JP | 2011-141523 A | 7/2011 |
| JP | 2011-154359 A | 8/2011 |

(56) References Cited

FOREIGN PATENT DOCUMENTS

| WO | WO-2004/114391 | 12/2004 |
|---|---|---|
| WO | WO-2011/081008 | 7/2011 |
| WO | WO-2013/118323 | 8/2013 |

OTHER PUBLICATIONS

Nishi.T et al., "P-143: Possibility of Reflective LC Display Using Oxide Semiconductor TFTs as Electronic Paper Display", SID Digest '10 : SID International Symposium Digest of Technical Papers, May 1, 2010, vol. 41, No. 1, pp. 1685-1688.
Godo.H et al., "Modeling and Measurement of Ultra-Low Leakage Current of IGZO TFTs and New Driving Method of LCDs", IDW '10 : Proceedings of the 16th International Display Workshops, 2010, pp. 235-238.
Miyake.H et al., "New Driving Method for Reducing Eye Strain Technology (REST) in Displaying Still Image Using CAAC IGZO LC Display", SID Digest '13 : SID International Symposium Digest of Technical Papers, 2013, pp. 935-938.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Asaoka.Y et al., "29.1:Polarizer-Free Reflective LCD Combined With Ultra Low-Power Driving Technology", SID Digest '09 : SID International Symposium Digest of Technical Papers, May 31 ,2009, pp. 395-398.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A(Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Sympoisum Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000°C", Journal of Solid State Chemistry, 1985, vol. 60, pp. 382-384.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

(56) References Cited

OTHER PUBLICATIONS

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350°C", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemcial Society), 2008, vol. 155, No. 12, pp. H1009-H1014.

Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-in. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

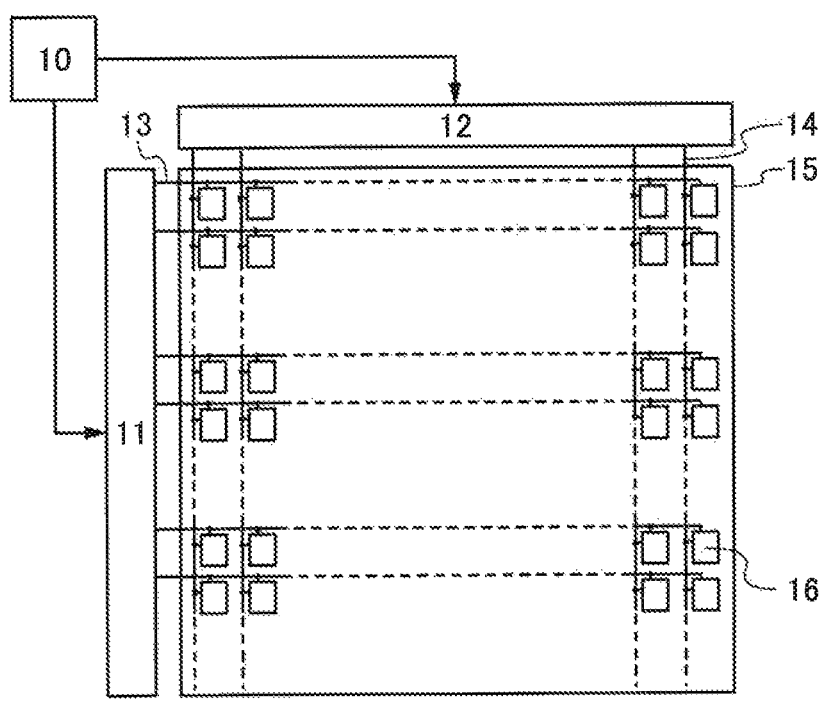

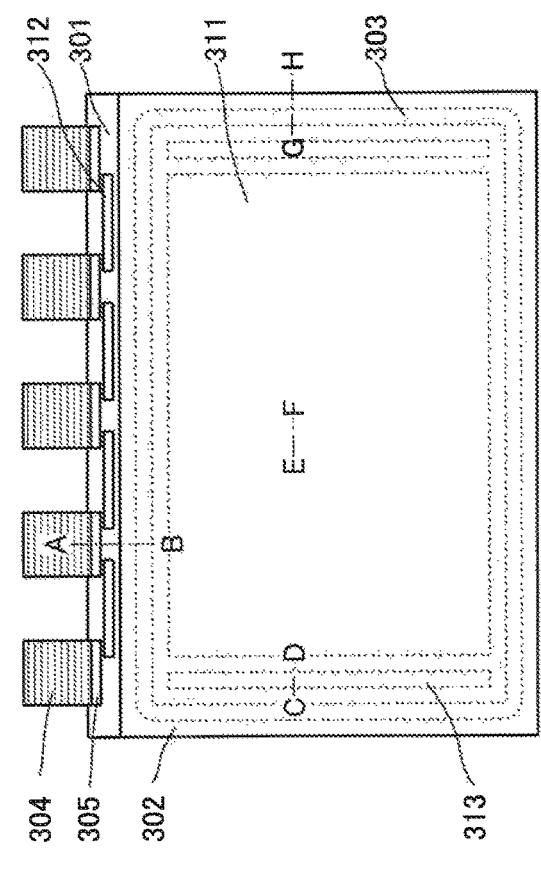
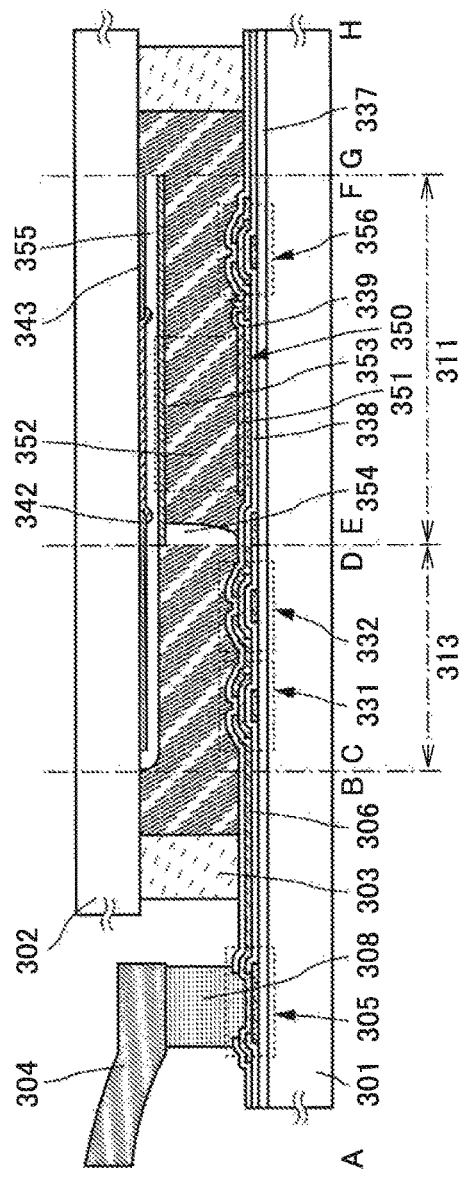
FIG. 9A
FIG. 9B

DISPLAY DEVICE

CROSS-REFERENCE TO RELATED APPLICATIONS

This application is a continuation of U.S. application Ser. No. 14/223,107, filed Mar. 24, 2014, now allowed, which claims the benefit of a foreign priority application filed in Japan as Serial No. 2013-069385 on Mar. 28, 2013, both of which are incorporated by reference.

BACKGROUND OF THE INVENTION

1. Field of the Invention

The present invention relates to an object, a method, or a manufacturing method. In addition, the present invention relates to a process, a machine, manufacture, or a composition of matter. In particular, one embodiment of the present invention relates to a semiconductor device, a display device, a light-emitting device, a driving method thereof, or a manufacturing method thereof. In particular, one embodiment of the present invention relates to a semiconductor device, a display device, or a light-emitting device each including an oxide semiconductor. Further, the present invention relates to display devices having the semiconductor devices. Note that a semiconductor device in this specification refers to a device that operates by utilizing semiconductor characteristics.

2. Description of the Related Art

Active matrix display devices are known. In the display device, transistors are provided in a plurality of pixels arranged in matrix. In each pixel, a video signal is rewritten by turning on the transistor and is held by turning off the transistor.

As the transistor, a transistor containing an oxide semiconductor attracts attention. This is because the transistor can be manufactured through manufacturing steps similar to those of a transistor containing amorphous silicon and has a high mobility. Further, the transistor containing an oxide semiconductor shows an extremely low off-state current (leakage current).

Patent Document 1 discloses a display device in which the above feature is utilized. Specifically, Patent Document 1 discloses a display device which has a reduced frequency of inputting video signals by using a transistor containing an oxide semiconductor. Thus, the display device has reduced power consumption.

Patent Document

[Patent Document 1] Japanese Published Patent Application No. 2011-141523

SUMMARY OF THE INVENTION

An object of one embodiment of the present invention is to further reduce power consumption of a display device and the like. An object of one embodiment of the present invention is to provide a method for driving a display device in which a frequency of changing a potential of a wiring is low. An object of one embodiment of the present invention is to provide a novel method for driving a display device.

An object of one embodiment of the present invention is to control a sequence of supply of video signals to a plurality of pixels in an active matrix display device.

For example, one embodiment of the present invention is a display device which includes a plurality of pixels and a signal line electrically connected to the plurality of pixels. A video signal is supplied to each of the plurality of pixels through the signal line according to a supply sequence. The supply sequence is determined so that potentials of video signals supplied to the plurality of pixels are in ascending order or in descending order.

One embodiment of the present invention also includes a display device which includes m×n pixels arranged in m rows and n columns (each of m and n is a natural number of two or more) and first to n-th signal lines. In the first signal line is electrically connected to the m pixels arranged in a first column. In the n-th signal line is electrically connected to the m pixels arranged in an n-th column. Video signals are supplied to the pixels in m rows and n columns row by row through any one of the first to n-th signal lines, according to a supply sequence. The supply sequence is determined so as to obtain a minimum total of total values of absolute values of changes in potentials because of sequential supply of m video signals to the first to n-th signal lines.

One embodiment of the present invention also includes a display device which includes m×n pixels arranged in m rows and n columns (m is a natural number of four or more and n is a natural number of two or more) and first to n-th signal lines. The first signal line is electrically connected to the m pixels arranged in a first column. The n-th signal line is electrically connected to the m pixels arranged in an n-th column. Video signals are supplied to the pixels in m rows and n columns every k rows (k is a natural number of two or more and m/2 or less) through any one of the first to n-th signal lines, according to a supply sequence. The supply sequence is determined so as to obtain a minimum total of total values of absolute values of changes in potentials because of sequential supply of m video signals to the first to n-th signal lines.

In a display device of one embodiment of the present invention, a sequence of supply of video signals to a plurality of pixels in an active matrix display device can be controlled. For example, a supply sequence is controlled so that potentials of the video signals are supplied to a plurality of pixels in ascending or descending order. Accordingly, the frequency of charge and discharge of electric charges on a signal line for supplying video signals to the plurality of pixels can be low. Consequently, power consumption of the display device can be low.

BRIEF DESCRIPTION OF THE DRAWINGS

FIG. 1 illustrates a structure example of a display device.

FIGS. 9A and 9B illustrate one embodiment of the present invention.

DETAILED DESCRIPTION OF THE INVENTION

Figure 2A:
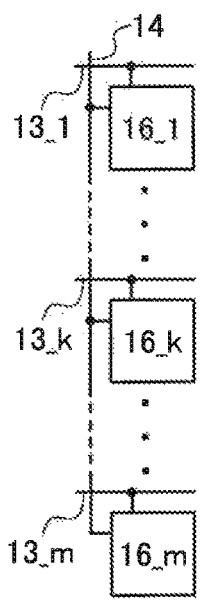
FIG. 2A illustrates part of the display device shown in FIG. 1, FIGS. 2B, 2D, and 2F show potentials (V14) of video signals, and FIGS. 2C, 2E, and 2G each show the amount of change in the potentials (ΔV14) of the video signals.

Embodiments of the present invention will be described below in detail. Note that the present invention is not limited to the description below, and a variety of changes can be made without departing from the spirit and scope of the present invention. Therefore, the present invention is not construed as being limited to the description given below.

Embodiment 1

A display device of one embodiment of the present invention will be described with reference to FIG. 1, FIGS. 2A to 2G, and FIGS. 3A to 3G.

(Structure Example of Display Device)

FIG. 1 illustrates a structure example of a display device and the like of one embodiment of the present invention. A display device or a display module illustrated in FIG. 1 includes, for example, a pixel portion 15, a circuit 10, a circuit 11, and a circuit 12. Note that it is possible that the circuit 10 be provided by a person different from one who manufactures the pixel portion 15 (e.g., a person to which the pixel portion 15 is transferred). Similarly, it is also possible that the circuit 11 or the circuit 12 be provided by a person different from one who builds the pixel portion 15 or the circuit 10.

The circuit 10 has a function of controlling the operations of the circuit 11 and the circuit 12. For example, the circuit 10 is capable of supplying a clock signal, a start pulse signal, a synchronization signal, an HSYNC signal, a VSYNC signal, a video signal, and the like to the circuit 11 and the circuit 12 at a predetermined timing. The circuit 10 functions as, for example, a controller.

To the circuit 11, m wirings 13 (m is a natural number of two or more) are connected. The circuit 11 has a function of controlling the potentials of the m wirings 13. For example, the circuit 11 is capable of supplying a selection signal to the wiring 13. The circuit 11 functions as, for example, a gate driver circuit or a scan line driver circuit. In the circuit structure of the circuit 11, a decoder circuit or the like may be provided to output selection signals in a predetermined order.

The circuit 12 has a function of controlling the potentials of n wiring 14 (n is a natural number of two or more). For example, the circuit 12 has a function of supplying video signals to the wiring 14. Alternatively, the circuit 12 has a function of supplying a precharge signal to the wiring 14. Alternatively, the circuit 12 has a function of supplying an initialization signal to the wiring 14. The circuit 12 functions as, for example, a source driver circuit or a data line driver circuit. Alternatively, the circuit 12 functions as, for example, a precharge circuit.

The pixel portion 15 includes a plurality of (m×n) pixels 16 arranged in matrix (m rows and n columns). In the pixel portion 15, the m wirings 13 and the n wiring 14 are extended. The wiring 13 in an i-th row is electrically connected to the n pixels 16 in the i-th row (i is a natural number of one or more and m or less) among the plurality of pixels 16 arranged in the m rows and the n columns in the pixel portion 15. The wiring 14 in a j-th column (j is a natural number of one or more and n or less) is electrically connected to the m pixels 16 in the j-th column among the plurality of pixels 16 arranged in the m rows and the n columns.

The wiring 13 or/and the wiring 14 can be construed as part of the pixel 16 and as being included in the pixel 16. Note that it is possible that in addition to the wiring 13 and the wiring 14, a wiring or an electrode (e.g., a capacitor wiring, a common wiring, or an electrode for a touch screen) be provided in the pixel portion.

In the display device illustrated in FIG. 1, moving images or still images can be displayed by rewriting video signals stored in the plurality of pixels 16 arranged in the m rows and the n columns, as appropriate. Note that a video signal is input from the circuit 12 to the pixel 16 through the wiring 14. In the pixel 16, the video signal is rewritten in a period in which a selection signal output from the circuit 11 is input through the wiring 13. That is, when the wiring 13 in a certain row is selected, a video signal supplied through the wiring 14 is input to a pixel connected to the wiring 13. The circuit 11 has a function of supplying a selection signal to the m wirings 13 in no particular order. A sequence of supply of a selection signal to the m wirings 13 is controlled by the circuit 10. The circuit 10 controls the circuit 12 so that the video signal in the pixel 16 is rewritten in accordance with the supply sequence.

In one example of a driving method, the circuit 11 has sequentially supplied a selection signal to the wirings 13 in the first to the last rows in one frame period (or one subframe period). That is, in the example, the pixels 16 are sequentially selected from the pixel 16 in the first row to the pixel 16 in the last row. Then, the circuit 12 has sequentially supplied video signals to the selected pixels 16 row by row through the wiring 14. After the selection of pixels in the first to the last rows and the supply of video signals to the pixels, the next frame period (or the next subframe period) has started to sequentially supply selection signals to the wirings 13 from the wiring 13 in the first row.

In this case, the pixels 16 are sequentially selected from those in the first row; accordingly, video signals for the selected pixels 16 are supplied from the circuit 12 to the wiring 14. Therefore, if the potentials of the video signals input to the adjacent pixels 16 in the same column are greatly different, the potential of the wiring 14 is changed accordingly. Consequently, power consumption due to charging and discharging the wiring 14 is high. For example, a potential A is supplied from the wiring 14 to the pixel 16 in a k-th row, a potential B (higher than the potential A) is supplied from the wiring 14 to the pixel 16 in a (k+1)th row, the potential A is supplied from the wiring 14 to the pixel 16 in a (k+2)th row, and the potential B is supplied from the wiring 14 to the pixel 16 in a (k+3)th row. In this case, the pixels are sequentially selected row by row. The wiring 14 is charged when the potential A is changed to the potential B, the wiring 14 is discharged when the potential B is changed to the potential A, and the wiring 14 is charged when the potential A is changed to the potential B again. Accordingly, charge and discharge of the wiring 14 are repeated, so that power is consumed by every switching between the charge and discharge.

On the other hand, in one embodiment of the present invention, the circuit 11 can supply selection signals to the wirings 13 in a predetermined order in one frame period (or one subframe period). That is, the pixels 16 are not sequentially selected from those in the first row to those in the last row but selected in a predetermined order. The circuit 12 can supply video signals for the pixels 16 selected in a predetermined order to the pixels. After all of the pixels 16 (or the predetermined number of the pixels 16) are selected and video signals are supplied to all of the pixels 16 (or the predetermined number of the pixels 16), the next frame period (or the next subframe period) starts, and then, selection signals are supplied in a predetermined order. Note that when the next frame period (or the next subframe period) starts, selection signals may be supplied in the same sequence as or in a different sequence from the sequence of supply of selection signals in the previous frame period (or the previous subframe period). The sequence of supply of selection signals is determined in accordance with video signals in the frame periods (or the subframe periods).

For example, the potential A is supplied from the wiring 14 to the pixel in the k-th row, the potential B (higher than the potential A) is supplied from the wiring 14 to the pixel in the (k+1)th row, the potential A is supplied from the wiring 14 to the pixel in the (k+2)th row, and the potential B is supplied from the wiring 14 to the pixel in the (k+3)th row. In this case, the pixels are selected not in sequence row by row but in the order for realizing a small amount of change in the potential of the wiring 14. For example, the pixel in the k-th row (or the (k+2)th row) is selected, and the potential A is supplied from the wiring 14; after that, the pixel in the (k+2)th row (or the k-th row) is selected, and the potential A is supplied from the wiring 14. In this case, the potential of the wiring 14 is not changed, and thus, power is not consumed. Next, the pixel in the (k+1)th row (or the (k+3)th row) is selected, and then, the potential B is supplied from the wiring 14. In this case, the potential of the wiring 14 is changed, and thus, power is consumed. Then, the pixel in the (k+3)th row (or the (k+1)th row) is selected, and then, the potential B is supplied from the wiring 14. In this case, the potential of the wiring 14 is not changed, and thus, power is not consumed. In this manner, by sequentially selecting the pixels in the k-th row (or the (k+2)th row), the (k+2)th row (or the k-th row), the (k+1)th row (or the (k+3)th row), and the (k+3)th row (or the (k+1)th row), the amount of change in the potential of the wiring 14 can be small, so that power consumption can be low.

As another example, the pixel in the (k+1)th row (or the (k+3)th row) is selected, and then, the potential B is supplied from the wiring 14. Then, the pixel in the (k+3)th row (or the (k+1)th) is selected, and then, the potential B is supplied from the wiring 14. In this case, the potential of the wiring 14 is not changed, and thus, power is not consumed. Then, the pixel in the (k+2)th row (or the (k+4)th row) is selected, and then, the potential A is supplied from the wiring 14. In this case, the potential of the wiring 14 is changed, and thus, power is consumed. Next, the pixel in the (k+4)th row (or the (k+2)th row) is selected, and then, the potential A is supplied from the wiring 14. In this case, the potential of the wiring 14 is not changed, and thus, power is not consumed. In this manner, by sequentially selecting the pixels in the (k+1)th row (or the (k+3)th row), the (k+3)th row (or the (k+1)th row), the (k+2)th row (or the (k+4)th row), and the (k+4)th row (or the (k+2)th row), the amount of changes the potential of the wiring 14 can be small, so that power consumption can be low.

In this manner, on the basis of the potentials of video signals supplied to pixels, the pixel first selected to be supplied with a video signal is determined. That is, a sequence of selecting pixels is determined so that the potentials of video signals are gradually changed. For example, the sequence of selecting the pixels is determined so that the potentials of the video signals are gradually increased or decreased. To carry out the sequence, selection signals are input to the wirings 13 and the video signals are input to the corresponding pixels. As a result, the potential of the wiring 14 is gradually increased or decreased, so that the amount of change and the amount of change in potential become small; accordingly, power for charge and discharge of the wiring 14 can be decreased.

Note that, in a frame period (or a subframe period), pixels are selected so that the potentials of video signals are gradually changed. Further, also in the next frame period (or the next subframe period), in the case where the pixels are selected so that the potentials of the video signals are gradually changed, a period from the end of a frame period to the start of the next frame period is preferably as long as possible. For example, the period from the end of a frame period to the start of the next frame period is six times or more, preferably sixty times or more as long as one frame period (or one subframe period), that is, a period from the start of the frame period (or the subframe period) to the end of the frame period (or the subframe period). For example, a period from the time of terminating the frame period to the time of starting the next frame period is 0.1 seconds or more, preferably 1 second or more. Accordingly, the number of inputs of the video signals is reduced, so that power consumption can be reduced. During the period, the video signals are held in the pixels. That is, the video signals are held for a period longer than one frame period (or one subframe period).

In the case where a pixel holds a video signal for a period longer than one frame period (or one subframe period) in this manner, a transistor in the pixel is preferably a transistor having a low off-state current. An example of a transistor having a low off-state current is a transistor with an active layer (a semiconductor film) containing an oxide semiconductor. For example, an oxide semiconductor is preferably a semiconductor containing In (indium), Ga (gallium), Zn (zinc), and O (oxygen).

Note that in the case where the pixels are selected so that the potentials of the video signals are gradually changed, a timing of inputting the video signals to the pixels is not in sequence row by row; accordingly, a timing of rewriting the video signals in the pixels are also not in sequence row by row but in a predetermined order. In general, pixels hold video signals and keep displaying an image in accordance with the video signals, in a period from the input of the video signals to the pixels to the rewriting of the video signals. Accordingly, periods for holding the video signals are different depending on the pixels in some cases. However, in the case where an interval from the end of a frame period to the start of the next frame period is long, the effect can be relatively small even when the periods for holding the video signals are different depending on the pixels. Therefore, the effect on display can be small. In the case where an image displayed in a frame period is the same as the image displayed in the next frame period, the same image is displayed even when the periods for holding the video signals are different depending on the pixels; accordingly, an effect on display does not occur. In such a case, a period from the end of a frame period to the start of the next frame period may be short and needs to be as long as about a normal blanking period.

Note that in the case where an image displayed in a frame period is different from an image displayed in the next frame period, that is, in the case where a moving image is displayed, the periods for holding the video signals in the pixels are preferably equal. Therefore, in such a case, it is preferable that the rows be sequentially selected and the video signals be supplied on the row-by-row basis.

In other words, in the case where a displayed image is a moving image, it is preferable that the pixels be selected row by row and the video signals be sequentially input while the moving image is displayed; on the other hand, in the case where a displayed image is a still image, it is preferable that the pixels be selected in a predetermined order and the video signals be input to realize low power consumption while the still image is displayed.

In one embodiment of the present invention, in one frame period (or one subframe period), video signals supplied to the pixels 16 connected to the wiring 14 in a certain column are rearranged to generally increase or decrease the potentials of the video signals, and the wirings 13 are selected in accordance with the rearranged order. Then, the video signals are supplied to the pixels 16 connected to the wiring 13 through the wiring 14 in the certain column in accordance with the rearranged order. At that time, compared to the case where the wirings 13 are sequentially selected row by row and video signals are supplied to the pixels 16 row by row, the amount of change in the potential of the wiring 14 in the certain column is small and power consumed by charge and discharge of the wiring 14 in the certain column is low.

(Method 1 for Determining Sequence of Supply of Video Signals to m×n Pixels)

One example of a method for determining the supply sequence of the circuit 10 will be described with reference to FIGS. 2A to 2G. Note that FIG. 2A illustrates the part of the display device shown in FIG. 1. Specifically, FIG. 2A illustrates the pixel 16 connected to the wiring 14 in a certain column.

Figure 2B:
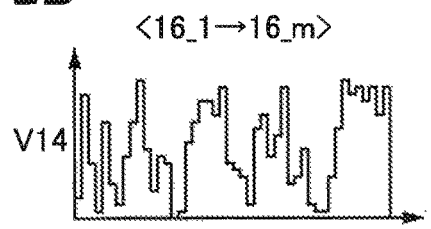
Figure 2C:
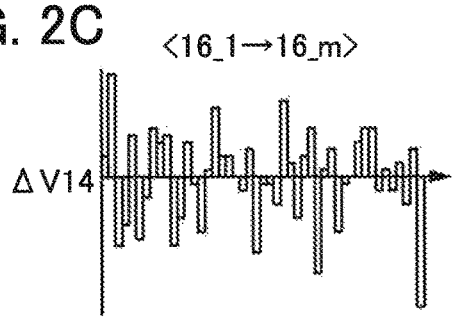

FIG. 2B is a graph which shows potentials (V14) of video signals input to the plurality of pixels 16_1 to 16_m illustrated in FIG. 2A through the wiring 14, in an order of the video signals to the pixels 16_1 to 16_m. FIG. 2B shows change in the potential of the wiring 14, for example, at the time when the wirings 13 are sequentially selected row by row and the video signals are input to the pixels 16 row by row; accordingly, in this case, the horizontal axis is also regarded as representing time. FIG. 2C shows the amount of change in the potentials of the video signals in the case shown in FIG. 2B (ΔV14), that is, shows the amount of change in the potentials of the video signals between adjacent rows. Accordingly, FIG. 2C is also regarded as a graph which shows change with time in the amount of electric charge charged and discharged in the wiring 14 at the time when the wirings 13 are sequentially selected row by row and the video signals are sequentially supplied to the pixels row by row.

Figure 2D:
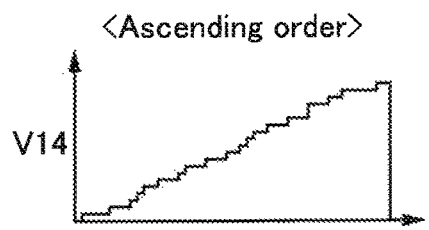

FIG. 2D is a graph which shows the potentials (V14) of the video signals input to the plurality of pixels 16_1 to 16_m illustrated in FIG. 2A through the wiring 14. The graph shows change in the potential of the wiring 14 at the time when the wirings 13 are selected so that the potentials of the video signals are gradually increased and the video signals are supplied to the pixels in the order in which the wirings 13 are selected. The horizontal axis represents time. FIG. 2E is a graph which shows the amount of change in the potentials of the video signals in the case shown in FIG. 2D (ΔV14), that is, shows change with time in the amount of electric charge charged and discharged in the wiring 14.

Figure 2F:
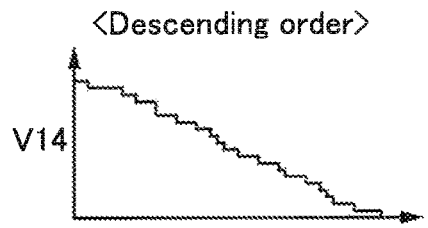
Figure 2E:
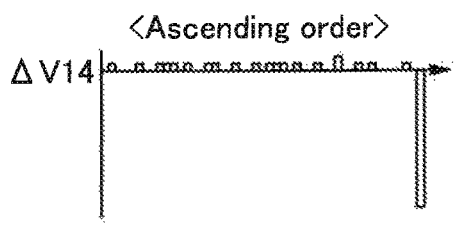
Figure 2G:
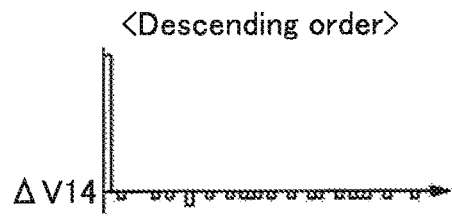

FIG. 2F is a graph which shows the potentials (V14) of the video signals input to the plurality of pixels 16_1 to 16_m illustrated in FIG. 2A through the wiring 14. The graph shows change in the potential of the wiring 14 at the time when the wirings 13 are selected so that the potentials of the video signals are gradually decreased and the video signals are supplied to the pixels in the order in which the wirings 13 are selected. The horizontal axis represents time. FIG. 2G is a graph which shows the amount of change in the potentials of the video signals in the case shown in FIG. 2F (ΔV14), that is, shows change with time in the amount of electric charge charged and discharged in the wiring 14.

First, the circuit 10 selects one column in the matrix, that is, the m pixels 16_1 to 16_m of the m×n pixels (see FIG. 2A).

Next, in one frame period (or one subframe period), the potentials of the video signals input to the m pixels 16_1 to 16_m are identified. For example, the potential of the video signal of the pixel 16_1 to the potential of the video signal of the pixel 16_m are sequentially identified (see FIG. 2B). From change in potential supplied to the wiring 14 according to the order, it is found that the amount of change in the potential is large and a large amount of electric charge needs to be charged and discharged, and accordingly, power consumption is high (see FIG. 2C).

Then, the plurality of video signals are rearranged so that the potentials of the video signals supplied to the plurality of pixels 16_1 to 16_m are sorted in ascending order (see FIG. 2D) or in descending order (see FIG. 2F). Note that the rearrangement operation may be performed in the circuit 10 or in frame memory, an image processing circuit, or the like.

Then, the circuit 10 controls the sequence of supply of the video signals to the plurality of pixels 16_1 to 16_m according to the order determined by the rearrangement. Specifically, the circuit 10 controls the circuit 11 and the circuit 12 to supply the plurality of video signals to the plurality of pixels 16_1 to 16_m in ascending order or in descending order. In other words, the circuit 10 controls the circuit 11 and the circuit 12 to monotonously increase the potential of the wiring 14 (see FIG. 2D) or monotonously decrease the potential of the wiring 14 (see FIG. 2F). That is, the circuit 11 operates to select the wirings 13_1 to 13_m in the order determined by the rearrangement. Then, the circuit 12 operates to supply the video signals to the wiring 14 in the order determined by the rearrangement. As a result, the video signals are input to the pixels 16_1 to 16_m in the order determined by the rearrangement. The circuit 10 controls the circuit 11 and the circuit 12 to operate in the above manner.

Accordingly, the amount of electric charge charged and discharged in the wiring 14 can be small (the total of absolute values of ΔV14 shown in FIGS. 2E and 2G is smaller than the total of absolute values of ΔV14 shown in FIG. 2C). Consequently, power consumption of the display device can be reduced.

(Supplementary Note)

Note that the case where the pixels in a certain column are selected and the circuits 11 and 12 are controlled are described with reference to FIGS. 2A to 2G. The wirings 13 are also connected to pixels provided in a column different from the column. Accordingly, even when the wiring 14 in a certain column is selected and the sequence of selecting the wirings 13 is determined to reduce power consumption, power consumption might do not sufficiently low in the order when video signals are supplied to pixels connected to the wiring 14 in another column. Therefore, for example, the amount of change in potential of the wiring 14 in each column is obtained as in FIG. 2C, and a column which has the largest amount of change is selected and the video signal supply sequence may be changed. That is, in the case of sequentially selecting the pixels row by row, a column which has the largest amount of change is selected and the selection sequence is determined to reduce power consumption in the column. Thus, power consumption can be effectively reduced.

Alternatively, the wiring 14 in the center column in the screen may be selected to control the circuits. Alternatively, the wiring 14 which is selected may be changed every frame period (every subframe period). Accordingly, an appropriate wiring can be selected.

Note that in the above description, for example, the potentials of video signals supplied to the plurality of pixels 16_1 to 16_*m* are all positive (see FIGS. 2B, 2D, and 2F). However, one embodiment of the present invention is not limited thereto. The potential is relative and is determined with reference to a certain potential, and therefore, the polarity of the potential depends on the level of the reference. For example, in a display device using a liquid crystal element, a positive potential and a negative potential can be alternately input to pixels (what is called inversion driving) in the case of setting the potential of a common electrode to zero as a reference. Accordingly, the present invention can be used also in the case where the potentials of the video signals supplied to the plurality of pixels 16_1 to 16_*m* include positive and negative values in one frame period (for example, in gate line inversion driving or dotted inversion driving). Further in a display device using an organic EL element, usually, inversion driving is not performed. However, the potentials of the video signals might include positive and negative values depending on parts, the potential of which is zero, also in which case the present invention can be used.

(Method 2 for Determining Sequence of Supply of Video Signals to m×n Pixels)

Figure 3A:
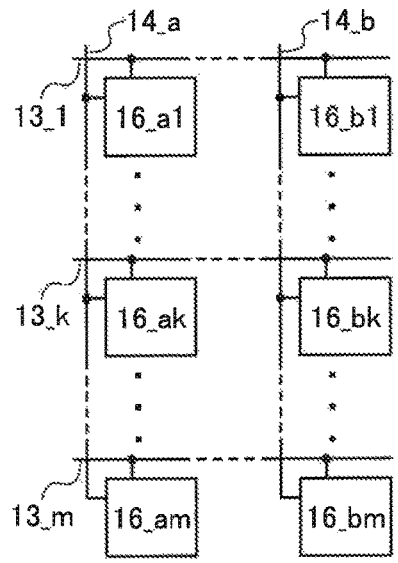
FIG. 3A illustrates part of the display device shown in FIG. 1, FIGS. 3B and 3D show potentials (V14) of video signals, FIGS. 3C and 3E each show the amount of change in the potentials (ΔV14) of the video signals.

The supply sequence of the video signal in the method 1 described above is determined according to the potential of one wiring 14 provided in a certain column. The wirings 13 are also connected to pixels provided in a column different from the column. Accordingly, even when the wiring 14 in a column is selected and the sequence of selecting the wirings 13 is determined to reduce power consumption, power consumption might do not sufficiently low in the order when video signals are supplied to pixels connected to the wiring 14 in another column. One example of a method for determining the video signal supply sequence which is different from that described with reference to FIGS. 2A to 2G will be described with reference to FIGS. 3A to 3G. Note that FIG. 3A illustrates the part of the display device shown in FIG. 1. Specifically, FIG. 3A illustrates the pixel connected to a wiring 14_*a* in a certain column and the pixel connected to a wiring 14_*b* in another column.

Figure 3B:
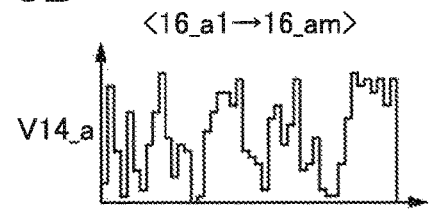
FIGS. 3F and 3G show values obtained by totaling absolute values of changes in the potentials of the video signals.
Figure 3C:
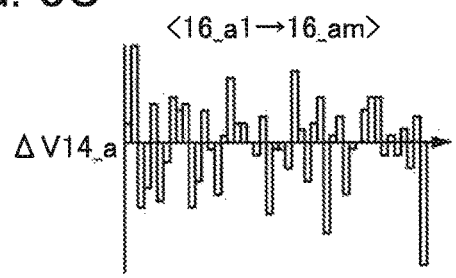
Figure 3D:
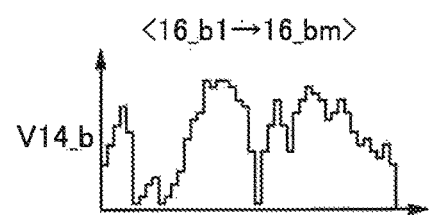
Figure 3E:
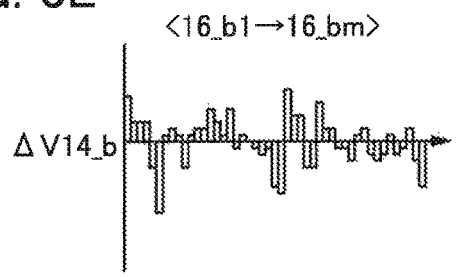

FIG. 3B is a graph which shows the potentials (V14_*a*) of the video signals input to a plurality of pixels 16_*a*1 to 16_*am* illustrated in FIG. 3A through the wiring 14_*a*, in order of a video signal of the pixel 16_*a*1 to a video signal of the pixel 16_*am*. FIG. 3C is a graph which shows the amount of change in potentials of the video signals (ΔV14_*a*) in the case of FIG. 3B. FIG. 3D is a graph which shows the potentials (V14_*b*) of the video signals input to a plurality of pixels 16_*b*1 to 16_*bm* illustrated in FIG. 3A through the wiring 14_*b*, in order of a video signal of the pixel 16_*b*1 to a video signal of the pixel 16_*bm*. FIG. 3E is a graph which shows the amount of change in potentials of the video signals (ΔV14_*b*) in the case of FIG. 3D.

FIGS. 3B and 3D are graphs which show change with time in the potentials of the wirings 14 when the wirings 13 are sequentially selected row by row and video signals are sequentially supplied to the pixels row by row, and FIGS. 3C and 3E are graphs which show the amount of electric charge charged and discharged in the wirings 14. Here, a sequence of selecting the wirings 13 is determined so that the total amount of change in potentials of the video signals in FIGS. 3C and 3E is minimized. Therefore, only in the wiring 14_*a*, the wirings 13 are not always selected so that the potentials of the video signals become gradually lower or higher. Similarly, only in the wiring 14_*b*, the wirings 13 are not always selected so that the potentials of the video signals become gradually lower or higher. In consideration of change in the potentials of both the wirings 14_*a* and 14_*b*, the sequence of selecting the wirings 13 is determined to minimize the power consumption.

The following is an example of a method for determining the sequence of selecting the wirings 13 in consideration of both the wirings 14_*a* and 14_*b*. First, the sequence of selecting the wirings 13 is determined so that power consumption in the wiring 14_*a* becomes low. Next, the sequence of selecting the wirings 13 is determined so that power consumption in the wiring 14_*b* becomes low. Then, the two selection sequences are compared. The same parts of the selection sequences are determined to be used. In the case where the selection sequences in the wirings 14_*a* and 14_*b* are different as a result of the comparison, calculation of power consumption is carried out assuming some selection sequences. Consequently, the selection sequence realizing low power consumption is determined to be used.

Alternatively, the sequence of selecting the wirings 13 is changed depending on the situation, and the total of power consumption in the wiring 14_*a* (the total amount of change in the potential of video signals) and power consumption in the wiring 14_*b* (the total amount of change in the potential of video signals) at that time is obtained. The wirings 13 are selected in the order by which the total is minimized.

Figure 3F:
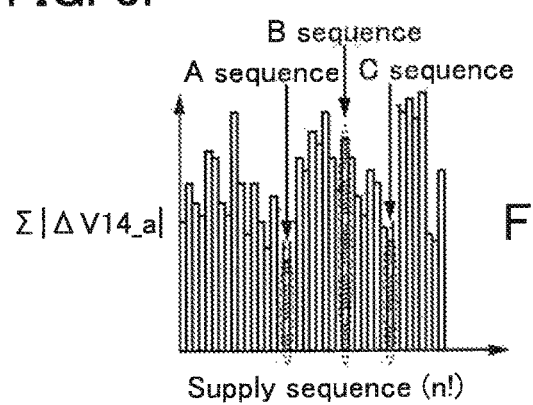
Figure 3G:
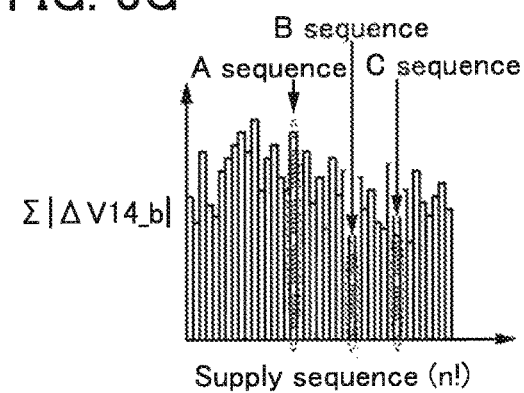

FIG. 3F is a graph which shows the total of the absolute values of the amount of change (ΔV14_*a*) in the potentials of the video signals (Σ|ΔV14_*a*|) in each of the plurality of (a factorial of m of) sequences of supply of the video signals to the plurality of pixels 16_*a*1 to 16_*am*. FIG. 3G is a graph which shows the total of the absolute values of the amount of change (ΔV14_*b*) in the potentials of the video signals (Σ|ΔV14_*b*|) in each of the plurality of (a factorial of m of) sequences of supply the video signals to the plurality of pixels 16_*b*1 to 16_*bm*.

First, the circuit 10 selects two columns in the matrix, that is, the 2×m pixels 16_*a*1 to 16_*am*, and 16_*b*1 to 16_*bm* of the m×n pixels (see FIG. 3A).

Here, various methods for determining two columns of the wirings 14 to be selected can be given. For example, two columns which show the largest amount of change in the potentials of the video signals shown in FIGS. 3C and 3E are selected. Alternatively, one column on the right side and one column on the left side of the display screen are selected. Alternatively, columns which are selected may be changed every frame period (or every subframe period).

Next, in one frame period (or one subframe period), the potentials of the video signals input to the 2×m pixels (16_*a*1 to 16_*am*, and 16_*b*1 to 16_*bm*) are identified. For example, the potential of the video signal of the pixel 16_*a*1 to the potential of the video signal of the pixel 16_*am* are sequentially identified (see FIG. 3B), and the potential of the video signal of the pixel 16_b1 to the potential of the video signal of the pixel 16_$bm$ are sequentially identified (see FIG. 3D).

The total of the absolute values of change ($\Delta$V14_$a$) in the potentials of the video signals ($\Sigma|\Delta$V14_$a|$) in each of the plurality of (a factorial of m of) sequences of supply of the video signals to the plurality of pixels 16_a1 to 16_$am$ is calculated (see FIG. 3F). The total of the absolute values of change ($\Delta$V14_$b$) in the potentials of the video signals ($\Sigma|\Delta$V14_$b|$) in each of the plurality of (a factorial of m of) sequences of supply of the video signals to the plurality of pixels 16_b1 to 16_$bm$ is calculated (see FIG. 3G).

Next, the sequence which minimizes the total of the former total value ($\Sigma|\Delta$V14_$a|$) and the latter total value ($\Sigma|\Delta$V14_$b|$) is used as the sequence for supplying the video signals to the plurality of pixels 16_a1 to 16_$am$ and 16_b1 to 16_$bm$. For example, in FIGS. 3F and 3G, an A sequence (a video signal supply sequence for minimizing the former total value) nor a B sequence (a video signal supply sequence for minimizing the latter total value) is used as a video signal supply sequence. In this case, a C sequence by which the total of the former total value and the latter total value is minimized is used. Then, the circuit 10 controls the circuit 11 and the circuit 12 in accordance with the C sequence so that the video signals are supplied to the plurality of pixels 16_a1 to 16_$am$ and 16_b1 to 16_$bm$.

First, the sequence of selecting the wirings 13 is determined so that power consumption in the wiring 14_$a$ becomes low. Next, the sequence of selecting the wirings 13 is determined so that power consumption in the wiring 14_$b$ becomes low. Then, the two selection sequences are compared. The same parts of the selection sequences are determined to be used. Determination on different parts in the selection sequences in the wirings 14_$a$ and 14_$b$ as a result of the comparison is made separately. For example, as shown in FIGS. 3F and 3G, the absolute values of changes in potentials of video signals in the sequence of supply of the plurality of video signals may be summed up and the selection sequence may be determined so that power consumption becomes low.

Accordingly, the amount of electric charge charged and discharged in the wirings 14_$a$ and 14_$b$ can be small. Consequently, power consumption of the display device can be reduced.

(Supplementary Note)

Note that in the above description, the potentials of video signals supplied to the plurality of pixels 16_a1 to 16_$am$, and 16_b1 to 16_$bm$ are all positive (see FIGS. 3B and 3D). However, the present invention is not limited thereto. The present invention can be used in the case where the potentials of the video signals supplied to the plurality of pixels 16_a1 to 16_$am$ and 16_b1 to 16_$bm$ include positive and negative values (for example, in gate line inversion driving or dotted inversion driving).

In the above description, two columns are selected from the matrix (see FIG. 3A), for example. However, the present invention is not limited thereto. Three or more columns may be selected and the video signal supply sequence may be determined to minimize power consumption of a plurality of pixels in the columns.

Embodiment 2

A display device of one embodiment of the present invention which is different from the display device described in the above embodiment will be described with reference to FIGS. 4A to 4F.

(Structure Example of Display Device)

A display device disclosed in this embodiment has a structure similar to that of the display device illustrated in FIG. 1. Note that the display device disclosed in this embodiment has a structure partly different from that of the display device illustrated in FIG. 1. Specifically, the circuit 11 illustrated in FIG. 1 has a function of supplying selection signals to the m wirings 13 in a predetermined order, whereas the circuit 11 disclosed in this embodiment includes a plurality of shift registers each having a function of supplying selection signals to a plurality of scan lines in sequence. In the display device disclosed in this embodiment, the plurality of shift registers supply selection signals in a predetermined order.

Figure 4A:
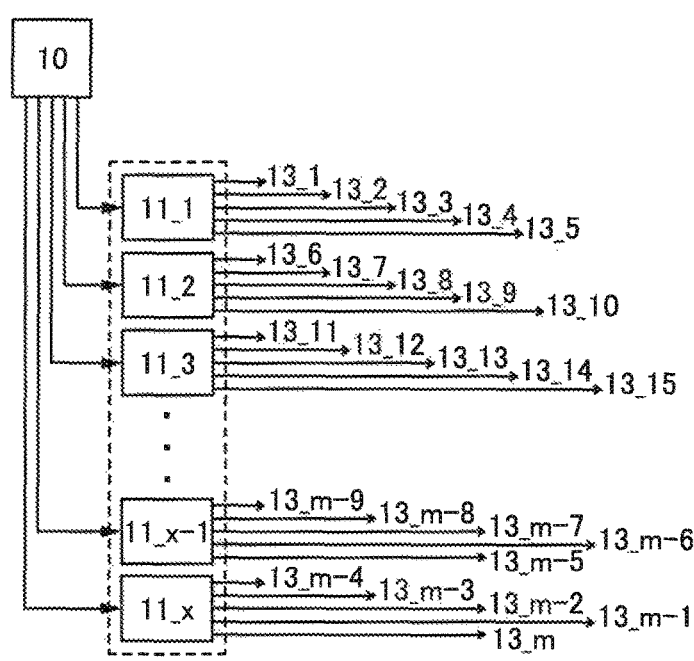
FIGS. 4A and 4B illustrate parts of the display device shown in FIG. 1, FIGS. 4C and 4E show potentials (V14) of video signals, and FIGS. 4D and 4F each show the amount of change in the potentials (ΔV14) of the video signals.

FIG. 4A illustrates a structure example of the circuit 11 included in the display device disclosed in this embodiment. The circuit 11 illustrated in FIG. 4A includes a plurality of shift registers 11_1 to 11_$x$, operation of which is controlled by the circuit 10. Note that the shift register 11_1 has a function of supplying selection signals to the wirings 13_1 to 13_5 in sequence. Each of the shift registers 11_2 to 11_$x$ also has a function of supplying selection signals to specific five scan lines in sequence. Note that a structure of a scan line driver circuit included in the display device disclosed in this specification is not limited to that in FIG. 4A. For example, the scan line driver circuit may have a shift register having a function of supplying selection signals to wirings in sequence in addition to assigned five scan lines. Alternatively, the scan line driver circuit may have a plurality of types of shift registers which have functions of supplying selection signals to scan lines.

(Method for Determining Video Signal Supply Sequence)

Figure 4B:
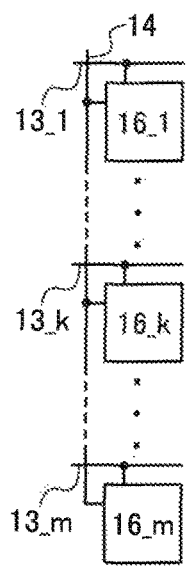
Figure 4C:
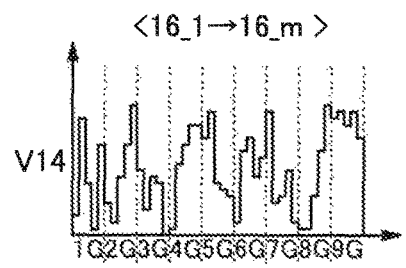
Figure 4E:
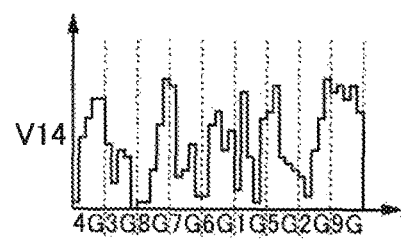
Figure 4D:
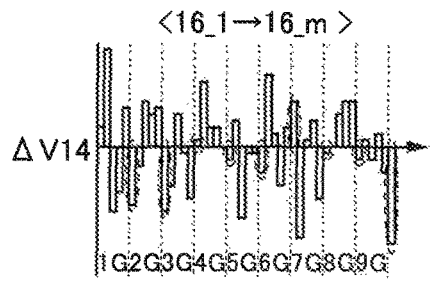
Figure 4F:
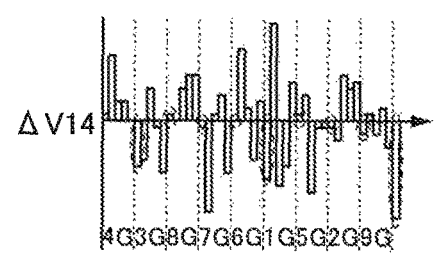

One example of a method for determining the supply sequence by the circuit 10 will be described with reference to FIGS. 4B to 4F. FIG. 4B shows part of the display device disclosed in this embodiment. FIGS. 4C and 4E are graphs of the potentials (V14) of video signals input to the plurality of pixels 16_1 to 16_$m$ illustrated in FIG. 4B through the wiring 14. FIGS. 4D and 4F are graphs showing the amount of change in the potentials ($\Delta$V14) of the video signals. Note that in FIGS. 4C to 4F, video signals are divided into groups (1G to 9G). A plurality of video signals in one group is input to one of a plurality of pixels to which selection signals are supplied from one shift register.

First, the circuit 10 selects a column in the matrix.

Next, in one frame period, the potentials of the video signals input to the m pixels 16_1 to 16_$m$ are identified. For example, the potential of the video signal of the pixel 16_1 to the potential of the video signal of the pixel 16_$m$ are sequentially identified (see FIG. 4C). The amount of the change in potential in the case where the plurality of video signals are supplied is identified according to the order (see FIG. 4D). Note that in the display device disclosed in this embodiment, it is unnecessary to identify all of the video signals input to the m pixels 16_1 to 16_$m$. Specifically, at least the potentials of the video signals which are supplied to the groups (1G to 9G) first and last need to be identified.

Then, the groups 1G to 9G are rearranged to minimize change in the potential, which occurs in switching the groups (see FIG. 4E). Specifically, the groups 1G to 9G are rearranged so that the total of $\Delta$V14 at dotted lines in FIGS. 4D and 4F is minimized.

Accordingly, the amount of electric charge charged and discharged in the wirings 14 can be small. Consequently, power consumption of the display device can be reduced.

(Supplementary Note)

In the above description, one column is selected from the matrix (see FIG. 4B), for example. However, the present invention is not limited thereto. Two or more columns may be selected and the video signal supply sequence may be determined to minimize power consumption of a plurality of pixels in the columns.

Embodiment 3

In this embodiment, a circuit structure that can be used for the pixel 16 in the display device illustrated in FIG. 1 is described with reference to FIGS. 6A and 6B. The display device of one embodiment can functions as various types of display devices when the display element in the pixel 16 is changed.

A

In this specification and the like, a display element, a display device, which is a device including a display element, a light-emitting element, and a light-emitting device, which is a device including a light-emitting element, can employ various modes or can include various elements. Some display elements, display devices, light-emitting elements, or light-emitting devices each include a display medium whose contrast, luminance, reflectance, transmittance, or the like is changed by electromagnetic action, such as an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on the amount of current), an electron emitter, a liquid crystal element, electronic ink, an electrophoretic element, a grating light valve (GLV), a plasma display panel (PDP), a digital micromirror device (DMD), a piezoelectric ceramic display, or a carbon nanotube. Examples of a display device including an EL element include an EL display and the like. Examples of a display device including an electron emitter include a field emission display (FED), an SED-type flat panel display (SED: surface-conduction electron-emitter display), and the like. Examples of a display device including a liquid crystal element include liquid crystal displays (e.g., a transmissive liquid crystal display, a transflective liquid crystal display, a reflective liquid crystal display, a direct-view liquid crystal display, a projection liquid crystal display), and the like. Examples of a display device including electronic ink or an electrophoretic element include electronic paper, and the like.

B

An example of an EL element is an element including an anode, a cathode, and an EL layer interposed between the anode and the cathode. Examples of an EL layer include, but are not limited to, a layer utilizing light emission (fluorescence) from a singlet exciton, a layer utilizing light emission (phosphorescence) from a triplet exciton, a layer utilizing light emission (fluorescence) from a singlet exciton and light emission (phosphorescence) from a triplet exciton, a layer including an organic material, a layer including an inorganic material, a layer including an organic material and an inorganic material, a layer including a high-molecular material, a layer including a low-molecular material, a layer including a high-molecular material and a low-molecular material, and the like. Note that various types of EL elements other than the above can alternatively be used.

C

An example of a liquid crystal element is an element that controls transmission and non-transmission of light by optical modulation action of liquid crystal. The element can include a pair of electrodes and a liquid crystal layer. The optical modulation action of liquid crystal is controlled by an electric field applied to the liquid crystal (including a lateral electric field, a vertical electric field, and a diagonal electric field). Specifically, any of the following can be used for liquid crystal, for example: nematic liquid crystal, cholesteric liquid crystal, smectic liquid crystal, discotic liquid crystal, thermotropic liquid crystal, lyotropic liquid crystal, low-molecular liquid crystal, high-molecular liquid crystal, polymer dispersed liquid crystal (PDLC), ferroelectric liquid crystal, anti-ferroelectric liquid crystal, main-chain liquid crystal, side-chain high-molecular liquid crystal, banana-shaped liquid crystal, and the like. Moreover, the following methods can be used for driving the liquid crystals, for example: a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an OCB (optically compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a PNLC (polymer network liquid crystal) mode, a guest-host mode, and a blue phase mode. Note that the present invention is not limited to the above elements and methods, and various liquid crystal elements and driving methods can be used as a liquid crystal element and a driving method thereof.

D

For example, display of electronic paper can be performed using molecules (a method utilizing optical anisotropy, dye molecular orientation, or the like), particles (a method utilizing electrophoresis, particle movement, particle rotation, phase change, or the like), movement of one end of a film, coloring properties or phase change of molecules, optical absorption by molecules, or self-light emission by combination of electrons and holes. Specifically, examples of a display method of electronic paper include, but are not limited to, microcapsule electrophoresis, horizontal electrophoresis, vertical electrophoresis, a spherical twisting ball, a magnetic twisting ball, a columnar twisting ball, a charged toner, electronic liquid powder, magnetic electrophoresis, a magnetic thermosensitive type, electro wetting, light-scattering (transparent-opaque change), a cholesteric liquid crystal and a photoconductive layer, cholesteric liquid crystal, bistable nematic liquid crystal, ferroelectric liquid crystal, a liquid crystal dispersed type with a dichroic dye, a movable film, coloring and decoloring properties of a leuco dye, photochromism, electrochromism, electrodeposition, and flexible organic EL. Note that various electronic paper and display methods other than the above can alternatively be used. Here, with the use of microcapsule electrophoresis, aggregation and precipitation of phoresis particles can be prevented. Electronic liquid powder has advantages such as high-speed response, high reflectivity, a wide viewing angle, low power consumption, and memory properties.

E

Figure 6A:
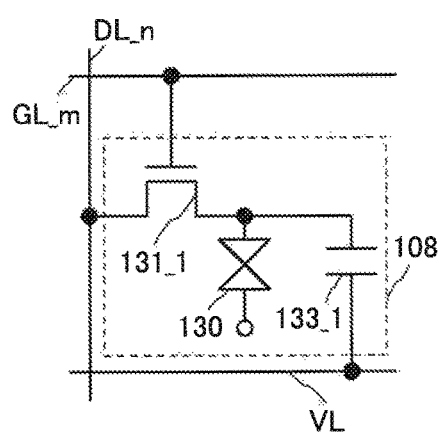
FIGS. 6A and 6B each show one embodiment of the present invention.

The pixel 16 in the display device illustrated in FIG. 1 can have the circuit structure illustrated in FIG. 6A.

F

The pixel circuit 108 illustrated in FIG. 6A includes a liquid crystal element 130, a transistor 131_1, and a capacitor 133_1.

G

Figure 6B:
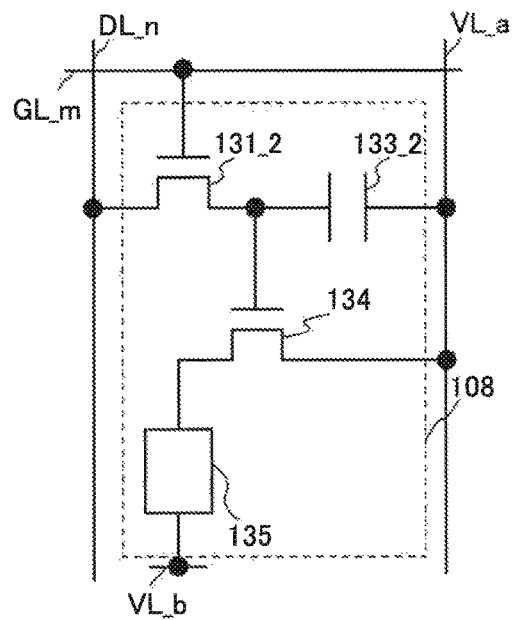

The pixel circuit 108 illustrated in FIG. 6B includes a transistor 131_2, a capacitor 133_2, a transistor 134, and a light-emitting element 135.

H

This embodiment can be combined with another embodiment in this specification as appropriate.

Embodiment 4

In this embodiment, a manufacturing method of a transistor in a display device of one embodiment of the present invention will be described.

A manufacturing method of a transistor 522 will be described with reference to FIGS. 7A to 7D and FIGS. 8A to 8C. FIGS. 7A to 7D and FIGS. 8A to 8C are cross sectional views illustrating one example of the manufacturing method of the transistor 522. The transistor 522 can be provided in at least one of the circuit 11, the circuit 12, and the pixel 16 illustrated in FIG. 1.

Components in FIGS. 7A to 7D and FIGS. 8A to 8C are described first. With reference to FIGS. 7A to 7D and FIGS. 8A to 8C, a substrate 400, a conductive film 401, a gate electrode 402, a first insulating film 403, a second insulating film 404, an oxide semiconductor film 405, an island-shaped oxide semiconductor film 406, a conductive film 407, a source electrode 408, a drain electrode 409, an insulating film 410, an insulating film 411, and an insulating film 412 are described in order.

Figure 7A:
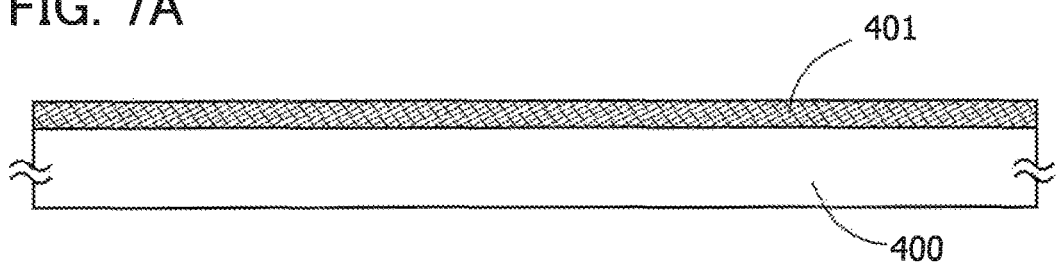
FIGS. 7A to 7D illustrate one embodiment of the present invention.

As illustrated in FIG. 7A, the conductive film 401 serving as a wiring and an electrode in the first layer is formed over the substrate 400.

Note that as the conductive film 401, a film in which a copper film is stacked over a tungsten nitride film or a single-layer tungsten film can be formed.

Figure 7B:
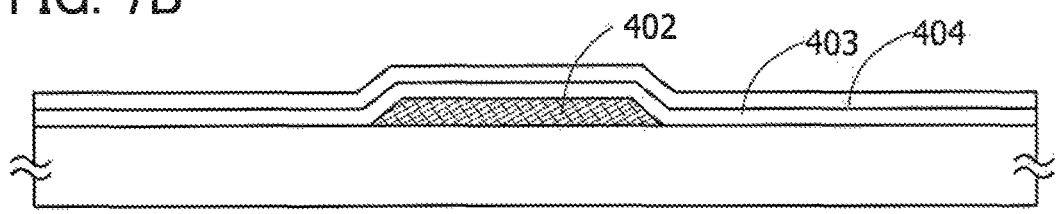

Next, as illustrated in FIG. 7B, the conductive film 401 is processed into the gate electrode of the transistor.

The first insulating film 403 is formed to cover the gate electrode 402. Then, the second insulating film 404 is formed over the first insulating film 403.

The first insulating film 403 and the second insulating film 404 serve as gate insulating films of the transistor.

For example, a multilayer film including a silicon nitride film as the first insulating film 403 and a silicon oxide film as the second insulating film 404 can be used. As the second insulating film 404, a silicon oxide nitride film can be used instead of a silicon oxide film serving. As the first insulating film 403, a silicon nitride oxide film can be used instead of a silicon nitride film.

As the silicon oxide film, a silicon oxide film with a low defect density is preferably used. Specifically, a silicon oxide film whose density of a spin corresponding to a signal with a g factor of 2.001 in electron spin resonance (ESR) is less than or equal to $3\times10^{17}$ spins/cm$^3$, preferably less than or equal to $5\times10^{16}$ spins/cm$^3$ is used. As the silicon oxide film, a silicon oxide film containing excess oxygen is preferably used. As the silicon nitride film, a silicon nitride film from which hydrogen and ammonia are less released is used. The amount of discharge of hydrogen or ammonia may be measured by thermal desorption spectroscopy (TDS).

Figure 7C:
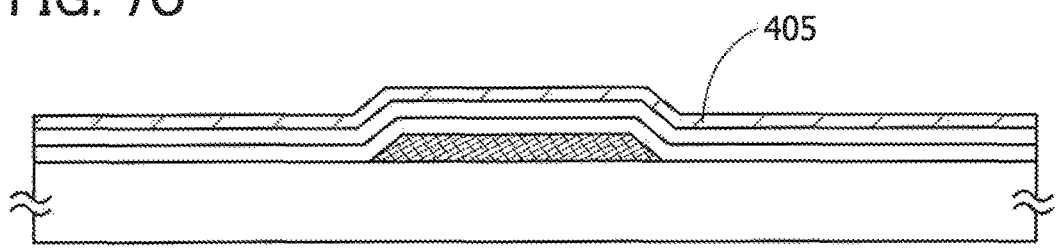

Then, as illustrated in FIG. 7C, the oxide semiconductor film 405 is formed over the second insulating film 404. Here, the oxide semiconductor film 405 is formed using an In—Ga—Zn oxide film by a sputtering method.

As the oxide semiconductor used for the semiconductor layer of the transistor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide deposited using an oxide with an atomic ratio where In:Ga:Zn=1:1:1, In:Ga:Zn=3:1:2, or In:Ga:Zn=2:1:3, or an oxide with an atomic ratio close to the above atomic ratios as a target may be used.

When the oxide semiconductor film forming the semiconductor layer contains a large amount of hydrogen, the hydrogen and the oxide semiconductor are bonded to each other, so that part of the hydrogen serves as a donor and causes generation of an electron which is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Therefore, it is preferable that treatment be performed so that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment or treatment for making the oxygen content of an oxide semiconductor film be in excess of that in the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density of lower than or equal to $1 \times 10^{17}/\text{cm}^3$, lower than or equal to $1 \times 10^{16}/\text{cm}^3$, lower than or equal to $1 \times 10^{15}/\text{cm}^3$, lower than or equal to $1 \times 10^{14}/\text{cm}^3$, or lower than or equal to $1 \times 10^{13}/\text{cm}^3$.

In this manner, the transistor including an i-type (intrinsic) or substantially i-type oxide semiconductor film can have extremely favorable off-state current characteristics. For example, the drain current at the time when the transistor including an oxide semiconductor film is in an off-state can be less than or equal to $1 \times 10^{-18}$ A, preferably less than or equal to $1 \times 10^{-21}$ A, further preferably less than or equal to $1 \times 10^{-24}$ A at room temperature (about 25° C.); or less than or equal to $1 \times 10^{-15}$ A, preferably less than or equal to $1 \times 10^{-18}$ A, further preferably less than or equal to $1 \times 10^{-21}$ A at 85° C. Note that an off state of an n-channel transistor refers to a state where the gate voltage is sufficiently lower than the threshold voltage. Specifically, the transistor is in an off state when the gate voltage is lower than the threshold voltage by 1V or more, 2V or more, or 3V or more.

A structure of the oxide semiconductor film is described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

In this specification, a term "parallel" indicates that the angle formed between two straight lines is greater than or equal to −10° and less than or equal to 100, and accordingly also includes the case where the angle is greater than or equal to −5° and less than or equal to 5°. In addition, a term "perpendicular" indicates that the angle formed between two straight lines is greater than or equal to 80° and less than or equal to 1000, and accordingly includes the case where the angle is greater than or equal to 85° and less than or equal to 950°.

In this specification, trigonal and rhombohedral crystal systems are included in a hexagonal crystal system.

Note that in an electron diffraction pattern of the CAAC-OS film while a cross-sectional TEM image of the film is obtained, spots (bright spots) having c-axis alignment are observed.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (f scan) is performed under conditions where the sample is rotated around a normal vector of a sample surface as an axis (f axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of crystallinity in the vicinity of the top surface is higher than that in the vicinity of the formation surface in some cases.

Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appears at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a polycrystalline oxide semiconductor film is described.

In an image obtained with a TEM, for example, crystal grains can be found in the polycrystalline oxide semiconductor film. In most cases, the size of a crystal grain in the polycrystalline oxide semiconductor film is greater than or equal to 2 nm and less than or equal to 300 nm, greater than or equal to 3 nm and less than or equal to 100 nm, or greater than or equal to 5 nm and less than or equal to 50 nm in an image obtained with the TEM, for example. Moreover, in an image obtained with the TEM, a boundary between crystals can be found in the polycrystalline oxide semiconductor film in some cases.

The polycrystalline oxide semiconductor film may include a plurality of crystal grains, and alignment of crystals may be different in the plurality of crystal grains. A polycrystalline oxide semiconductor film is subjected to structural analysis with an XRD apparatus. For example, when the polycrystalline oxide semiconductor film including an InGaZnO$_4$ crystal is analyzed by an out-of-plane method, peaks of 2θ appear at around 31°, 36°, and the like in some cases.

The polycrystalline oxide semiconductor film has high crystallinity and thus has high electron mobility in some cases. Accordingly, a transistor including the polycrystalline oxide semiconductor film has high field-effect mobility. Note that there are cases in which an impurity is segregated at the grain boundary between the crystals in the polycrystalline oxide semiconductor film. Moreover, the grain boundary of the polycrystalline oxide semiconductor film becomes a defect state. Since the grain boundary of the polycrystalline oxide semiconductor film may serve as a carrier trap or a carrier generation source, a transistor including the polycrystalline oxide semiconductor film has larger variation in electrical characteristics and lower reliability than a transistor including a CAAC-OS film in some cases.

Next, a microcrystalline oxide semiconductor film is described.

In an image obtained with the TEM, crystal parts cannot be found clearly in the microcrystalline oxide semiconductor in some cases. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image obtained with TEM, a crystal grain cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in an electron diffraction pattern (also referred to as a selected-area electron diffraction area) of the nc-OS film obtained by using an electron beam having a diameter (e.g., larger than or equal to 50 nm) larger than that of a crystal part. Meanwhile, spots are shown in a nanobeam electron diffraction pattern of the nc-OS film obtained by using an electron beam having a probe diameter (e.g., larger than or equal to 1 nm and smaller than or equal to 30 nm) close to, or smaller than or equal to that of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Thus, the nc-OS film may have a higher carrier density than the CAAC-OS film. The oxide semiconductor film having a high carrier density may have high electron mobility. Thus, a transistor including the nc-OS film may have high field-effect mobility. The nc-OS film has a higher defect state density than the CAAC-OS film, and thus may have a lot of carrier traps. Consequently, a transistor including the nc-OS film has larger variation in electrical characteristics and lower reliability than a transistor including the CAAC-OS film. The nc-OS film can be formed easily as compared to the CAAC-OS film because nc-OS film can be formed even when a relatively large amount of impurities are included; thus, depending on the purpose, the nc-OS film can be favorably used in some cases. Therefore, a semiconductor device including the transistor including the nc-OS film can be manufactured with high productivity in some cases.

Next, an amorphous oxide semiconductor film is described.

The amorphous oxide semiconductor film has disordered atomic arrangement and no crystal part. For example, the amorphous oxide semiconductor film does not have a specific state as in quartz.

In an image obtained with a TEM, crystal parts cannot be found in the amorphous oxide semiconductor film.

When the amorphous oxide semiconductor film is subjected to structural analysis by an out-of-plane method with an XRD apparatus, a peak which shows a crystal plane does not appear. A halo pattern is observed in an electron diffraction pattern of the amorphous oxide semiconductor film. Further, a halo pattern is observed but a spot is not shown in a nanobeam electron diffraction pattern of the amorphous oxide semiconductor film.

The amorphous oxide semiconductor film contains impurities such as hydrogen at a high concentration. In addition, the amorphous oxide semiconductor film has a high density of defect states.

The oxide semiconductor film having a high impurity concentration and a high density of defect states has many carrier traps or many carrier generation sources.

Accordingly, the amorphous oxide semiconductor film has a much higher carrier density than the nc-OS film. Therefore, a transistor including the amorphous oxide semiconductor film tends to be normally on. Thus, in some cases, such an amorphous oxide semiconductor layer can be applied to a transistor which needs to be normally on. Since the amorphous oxide semiconductor film has a high density of defect states, carrier traps might be increased. Consequently, a transistor including the amorphous oxide semiconductor film has larger variation in electrical characteristics and lower reliability than a transistor including the CAAC-OS film or the nc-OS film.

Next, a single-crystal oxide semiconductor film is described.

The single-crystal oxide semiconductor film has a lower impurity concentration and a lower density of defect states (few oxygen vacancies). Thus, the carrier density can be decreased. Accordingly, a transistor including the single-crystal oxide semiconductor film is unlikely to be normally on. Moreover, since the single-crystal oxide semiconductor film has a lower impurity concentration and a lower density of defect states, carrier traps might be reduced. Thus, the transistor including the single-crystal oxide semiconductor film has small variation in electrical characteristics and accordingly has high reliability.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single-crystal oxide semiconductor film has a higher density than the CAAC-OS film. The CAAC-OS film has a higher density than the microcrystalline oxide semiconductor film. The polycrystalline oxide semiconductor film has a higher density than the microcrystalline oxide semiconductor film. The microcrystalline oxide semiconductor film has a higher density than the amorphous oxide semiconductor film.

Note that an oxide semiconductor film may be a stacked film including two or more kinds of an amorphous oxide semiconductor film, a microcrystalline oxide semiconductor film, and a CAAC-OS film, for example.

Figure 7D:
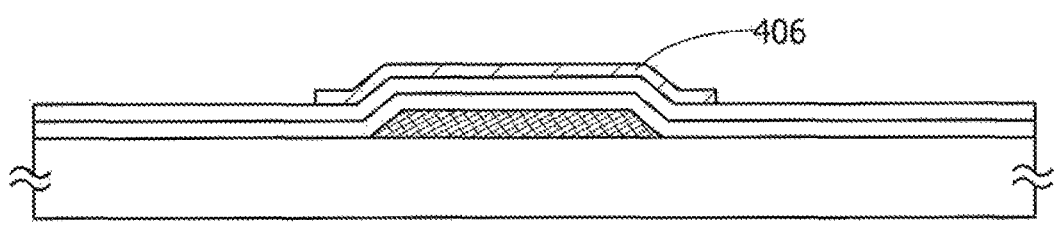

Next, as illustrated in FIG. 7D, the oxide semiconductor film 405 is processed into the island-shaped oxide semiconductor film 406.

Figure 8A:
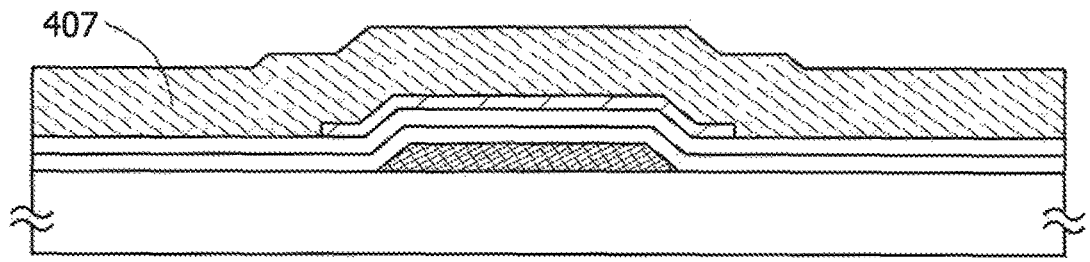
FIGS. 8A to 8C illustrate one embodiment of the present invention.

Then, as illustrated in FIG. 8A, the conductive film 407 is formed. The conductive film 407 can be formed in a manner similar to that of the conductive film 401. As an example, a three-layer structure is employed for the conductive film 407. Titanium films are formed as the first and third layers and an aluminum film is formed as the second layer. The titanium films and the aluminum film are formed by a sputtering method.

Figure 8B:
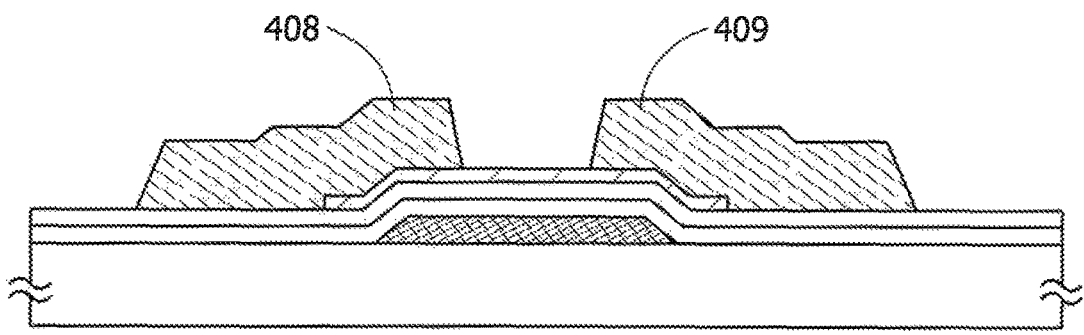

Next, as illustrated in FIG. 8B, the conductive film 407 is processed into the source electrode 408 and the drain electrode 409.

Figure 8C:
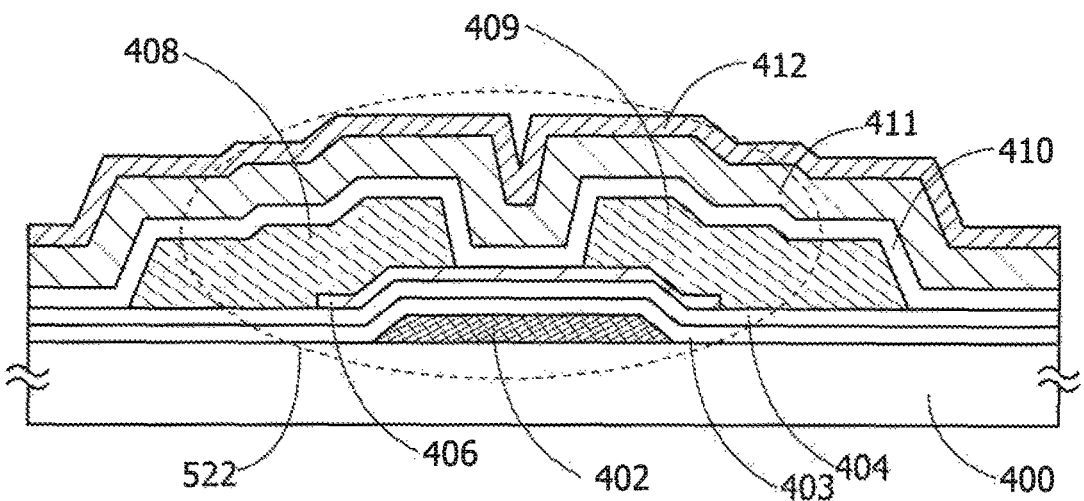

Next, as illustrated in FIG. 8C, the insulating films 410 to 412 are formed.

In the case where one or both of the insulating films 410 and 411 is/are oxide film(s), the oxide film in which the oxygen content is higher than that in the stoichiometric composition is preferably used. In that case, oxygen can be prevented from being released from the island-shaped oxide semiconductor film 406, and the oxygen contained in an oxygen-excess region can be transferred to the oxide semiconductor film to fill oxygen vacancies.

When the insulating film 411 is an oxide film in which the oxygen content is higher than that in the stoichiometric composition, the insulating film 410 is preferably an oxide film through which oxygen can pass. Oxygen which enters the insulating film 411 from the outside partly remains in the insulating film 411. Further, oxygen that has been originally contained in the insulating film 411 is released from the insulating film 411 to the outside in some cases. Thus, the insulating film 411 is preferably an oxide insulating film having a high coefficient of diffusion of oxygen.

When a nitride insulating film is used as the insulating film 412, an insulating film having a barrier property against nitrogen is preferably used as one or both of the insulating film 410 and the insulating film 411. For example, a dense oxide insulating film can have a barrier property against nitrogen. Specifically, an oxide insulating film whose etching rate is less than or equal to 10 nm per minute with use of 0.5 wt % fluoric acid at 25° C. is preferred.

The insulating films 410 to 412 can be formed by any of a variety of deposition methods such as a PECVD method and a sputtering method. It is preferable that the insulating films 410 to 412 be formed in succession in a vacuum. In such a case, entry of impurities into the interfaces between the insulating film 410, the insulating film 411, and the insulating film 412 can be inhibited. In the case where the insulating film 410 and the insulating film 411 are formed using the same kind of materials, the interface between the insulating film 410 and the insulating film 411 cannot be clearly defined in some cases.

For example, as the insulating films 410 and 411, a silicon oxide film or a silicon oxynitride film can be formed by a PECVD method under the following formation conditions. The substrate is held at a temperature higher than or equal to 180° C. and lower than or equal to 400° C., preferably higher than or equal to 200° C. and lower than or equal to 370° C., a deposition gas containing silicon and an oxidizing gas are introduced as a source gas into a treatment chamber, the pressure in the treatment chamber is greater than or equal to 20 Pa and less than or equal to 250 Pa, preferably greater than or equal to 40 Pa and less than or equal to 200 Pa, and high-frequency power is supplied to an electrode provided in the treatment chamber.

For example, in the case where a silicon nitride film with a low hydrogen content is formed by a PECVD apparatus as the insulating film 412, the insulating film 412 can be formed under the following conditions. The substrate is held at a temperature higher than or equal to 80° C. and lower than or equal to 400° C., preferably higher than or equal to 200° C. and lower than or equal to 370° C., a source gas is introduced into the treatment chamber, the pressure is greater than or equal to 100 Pa and less than or equal to 250 Pa, preferably greater than or equal to 100 Pa and less than or equal to 200 Pa, and high-frequency power is supplied to an electrode provided in the treatment chamber.

Preferably, heat treatment is performed after the insulating film 411 is formed, so that excess oxygen contained in the insulating film 410 or the insulating film 411 is transferred to the island-shaped oxide semiconductor film 406 to fill oxygen vacancies in the island-shaped oxide semiconductor film 406. The heat treatment can be performed as heat treatment for dehydration or dehydrogenation of the island-shaped oxide semiconductor film 406.

Note that this embodiment can be combined with any of the other embodiments in this specification as appropriate.

Embodiment 5

In this embodiment, an example of the structure of a liquid crystal display device that can be used as one embodiment of the present invention will be described with reference to drawings.

FIG. 9A is a top schematic diagram of a panel module 300 described in this embodiment.

The panel module 300 includes a pixel portion 311 including a plurality of pixels and a first driver circuit 313 in a sealed region surrounded by a first substrate 301, a second substrate 302, and a sealant 303. The first driver circuit 313 has a function as a scan signal line driver circuit. The panel module 300 also includes an external connection electrode 305 and an IC 312 functioning as a second driver circuit in a region outside the sealed region over the first substrate 301. The second driver circuit has functions as a data signal line driver circuit and a video signal driver circuit. Power and signals for driving the pixel portion 311, the first driver circuit 313, the IC 312, and the like can be input from an FPC 304 electrically connected to the external connection electrode 305.

FIG. 9B is a cross-sectional schematic diagram of a region including the FPC 304 and the sealant 303 along line A-B, a region including the first driver circuit 313 along line C-D, a region including the pixel portion 311 along line E-F, and a region including the sealant 303 along line G-H in FIG. 9A.

The first substrate 301 and the second substrate 302 are bonded to each other at their outer edge regions with the sealant 303. In the region surrounded by the first substrate 301, the second substrate 302, and the sealant 303, at least the pixel portion 311 is provided FIG. 9B illustrate an example where the first driver circuit 313 includes a circuit composed of n-channel transistors 331 and 332. Note that the first driver circuit 313 is not limited to having this structure and may include various CMOS circuits, in which an n-channel transistor and a p-channel transistor are used in combination, or a circuit composed of p-channel transistors. In this structure example, the panel module is a driver-integrated module in which the first driver circuit 313 is formed over the first substrate 301; however, one or both of the gate driver circuit and the second driver circuit may be provided over another substrate. For example, a driver circuit IC may be mounted by a COG method, or a flexible substrate (FPC) mounted with a driver circuit IC by a COF method may be mounted. In this structure example, the IC 312, which serves as the second driver circuit, is provided over the first substrate 301 by a COG method.

Note that there is no particular limitation on the structures of the transistors included in the pixel portion 311 and the first driver circuit 313. For example, a forward staggered transistor or an inverted staggered transistor may be used. Further, a top-gate transistor or a bottom-gate transistor may be used. As a semiconductor material used for the transistors, a semiconductor material such as silicon or germanium or an oxide semiconductor containing at least one of indium, gallium, and zinc may be used, for example.

Further, there is no particular limitation on the crystallinity of a semiconductor used for the transistors, and an amorphous semiconductor or a semiconductor having crystallinity (a microcrystalline semiconductor, a polycrystalline semiconductor, a single crystal semiconductor, or a semiconductor partly including crystal regions) may be used. The use of a semiconductor having crystallinity is preferable because deterioration of transistor characteristics can be reduced.

A typical example of an oxide semiconductor containing at least one of indium, gallium, and zinc is an In—Ga—Zn-based metal oxide. An oxide semiconductor having a wider band gap and lower carrier density than silicon is preferably used because off-state leakage current can be reduced.

For the panel module 300, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like can be used.

Alternatively, a normally black panel module such as a transmissive panel module utilizing a vertical alignment (VA) mode may be used. The vertical alignment mode is a method of controlling alignment of liquid crystal molecules of a display portion (display panel), in which liquid crystal molecules are aligned perpendicularly to a panel surface when no voltage is applied. Some examples are given as the vertical alignment mode. For example, a multi-domain vertical alignment (MVA) mode, a patterned vertical alignment (PVA) mode, an Advanced Super View (ASV) mode, and the like can be used. Moreover, it is possible to use a method called domain multiplication or multi-domain design, in which a pixel is divided into some regions (subpixels) and molecules are aligned in different directions in their respective regions.

In this embodiment, a panel module using a vertical alignment (VA) mode is described.

One pixel includes at least a switching transistor 356 and may also include a storage capacitor (not shown). A first electrode 351 electrically connected to a source electrode or a drain electrode of the transistor 356 is provided over an insulating film 339.

The liquid crystal element 350 provided in the pixel includes the first electrode 351 over the insulating film 339, a second electrode 353 on the second substrate 302, and liquid crystal 352 sandwiched between the first electrode 351 and the second electrode 353.

The first electrode 351 and the second electrode 353 are formed using a light-transmitting conductive material. As the light-transmitting conductive material, a conductive oxide such as indium oxide, indium tin oxide, indium zinc oxide, zinc oxide, zinc oxide to which gallium is added, or graphene can be used.

A color filter 343 and a black matrix 342 are provided on the second substrate 302 in at least a region overlapping with the pixel portion 311.

The color filter 343 is provided in order to adjust the color of light from a light source to increase the color purity. For example, in a full-color panel module using a white backlight, a plurality of pixels provided with color filters of different colors are used. In this case, the color filters may be those of three colors of red (R), green (G), and blue (B) or four colors (yellow (Y) in addition to these three colors). Further, a white (W) pixel may be added to R, G, and B pixels (and a Y pixel). That is, color filters of four colors (or five colors) may be used.

The black matrix 342 is provided between the adjacent color filters 343. The black matrix 342 blocks light entering from adjacent pixels, thereby preventing color mixture between the adjacent pixels. The black matrix 342 may be provided only between adjacent pixels of different emission colors and not between pixels of the same emission color. When the color filter 343 is provided so that its end portion overlaps with the black matrix 342, light leakage can be reduced. The black matrix 342 can be formed using a material that blocks light, for example, a metal material or a resin material including a pigment.

An overcoat 355 is provided to cover the color filter 343 and the black matrix 342. The overcoat 355 can suppress diffusion of impurities included in the color filter 343 and the black matrix 342, such as a pigment, into the liquid crystal 352. For the overcoat 355, a light-transmitting material is used, and an inorganic insulating material or an organic insulating material can be used.

The second electrode 353 is provided over the overcoat 355.

A spacer 354 is provided in a region where the overcoat 355 overlaps with the black matrix 342. The spacer 354 is preferably formed using a resin material because it can be formed thick. For example, the spacer 354 can be formed using a positive or negative photosensitive resin. When a light-blocking material is used for the spacer 354, the spacer 354 blocks light entering from adjacent pixels, thereby preventing color mixture between the adjacent pixels.

Although the spacer 354 is provided on the second substrate 302 side in this structure example, the spacer 354 may be provided on the first substrate 301 side. Alternatively, for the spacer 354, spherical particles of silicon oxide or the like may be used and scattered in a region where the liquid crystal 352 is provided.

An image can be displayed in such a manner that by application of voltage between the first electrode 351 and the second electrode 353, an electric field is generated in a direction vertical to surfaces of the electrodes and controls orientation of the liquid crystal 352, and polarization of light from a backlight provided outside the panel module is controlled in each pixel.

An alignment film for controlling orientation of the liquid crystal 352 may be provided on a surface in contact with the liquid crystal 352. A light-transmitting material is used for the alignment film.

In the display device illustrated in FIGS. 9A and 9B, the color filter is provided in a region overlapping with the liquid crystal element 350, so that a full-color image with higher color purity can be displayed. With the use of a plurality of light-emitting diodes (LEDs) that emit light of different colors as a backlight, a time-division display method (a field sequential driving method) can be employed. In the case of employing a time-division display method, the aperture ratio of the pixel or the number of pixels per unit area can be increased because neither color filters nor subpixels from which light of red (R), green (G), or blue (B), for example, is obtained are needed.

As the liquid crystal 352, a thermotropic liquid crystal, a low molecular weight liquid crystal, a polymer liquid crystal, a ferroelectric liquid crystal, an anti-ferroelectric liquid crystal, or the like can be used. Moreover, a liquid crystal exhibiting a blue phase is preferably used because an alignment film is not necessary and the viewing angle is wide. It is possible to use a polymer stabilized liquid crystal material obtained by adding a monomer and a polymerization initiator to any of the above liquid crystals and polymerizing the monomer after injection or dropping and sealing.

Although the liquid crystal element 350 in VA mode is described in the display device illustrated in FIGS. 9A and 9B, the liquid crystal element 350 is not limited to having this structure and can employ a different mode.

The first substrate 301 is provided with an insulating film 337 in contact with an upper surface of the first substrate 301, an insulating film 338 functioning as a gate insulating film of the transistors, and an insulating film 339 covering the transistors.

The insulating film 337 is provided in order to prevent diffusion of impurities included in the first substrate 301. The insulating films 338 and 339, which are in contact with semiconductor films of the transistors, are preferably formed using a material preventing diffusion of impurities that promote degradation of the transistors. For these insulating films, oxide, nitride, or oxynitride of a semiconductor such as silicon or a metal such as aluminum can be used, for example. Alternatively, a stack of such inorganic insulating materials or a stack of such an inorganic insulating material and an organic insulating material may be used. Note that the insulating films 337 and 339 are not necessarily provided when not needed.

An insulating film may be provided between the insulating film 339 and the first electrode 351 as a planarization layer that covers steps due to a transistor, a wiring, or the like placed below the insulating film 339. For such an insulating film, a resin material such as polyimide or acrylic is preferably used. An inorganic insulating material may be used as long as high planarity is obtained.

With the structure illustrated in FIG. 9B, the number of photomasks necessary for forming the transistor and the first electrode 351 of the liquid crystal element 350 over the first substrate 301 can be reduced. Specifically, only five photomasks are necessary for the following respective steps: a step of processing a gate electrode, a step of processing a semiconductor film, a step of processing source and drain electrodes, a step of forming an opening in the insulating film 339, and a step of processing the first electrode 351.

A wiring 306 over the first substrate 301 is provided to extend to the outside of the region sealed with the sealant 303 and is electrically connected to the first driver circuit 313. Part of an end portion of the wiring 306 is included in the external connection electrode 305. In this structure example, the external connection electrode 305 is formed by a stack of a conductive film used for the source and drain electrodes of the transistor and a conductive film used for the gate electrode of the transistor. The external connection electrode 305 is preferably formed by a stack of a plurality of conductive films as described above because mechanical strength against a pressure bonding step performed on the FPC 304 or the like can be increased.

Although not illustrated, a wiring and an external connection electrode that electrically connect the IC 312 and the pixel portion 311 can have the same structures as the wiring 306 and the external connection electrode 305.

A connection layer 308 is provided in contact with the external connection electrode 305. The FPC 304 and the external connection electrode 305 are electrically connected to each other through the connection layer 308. For the connection layer 308, a known anisotropic conductive film, various kinds of anisotropic conductive paste, or the like can be used.

The end portions of the wiring 306 and the external connection electrode 305 are preferably covered with an insulating film so that surfaces thereof are not exposed because oxidation of the surfaces and defects such as undesired short circuits can be suppressed.

This embodiment can be combined with any of the other embodiments in this specification as appropriate.

Embodiment 6

In this embodiment, a structure example of a light-emitting device which can be used as a display device of one embodiment of the present invention will be described with reference to drawings.

The light-emitting device can be either a passive matrix light-emitting device or an active matrix light-emitting device. In this embodiment, an active matrix light-emitting device is described with reference to FIGS. 10A and 10B.

Figure 10A:
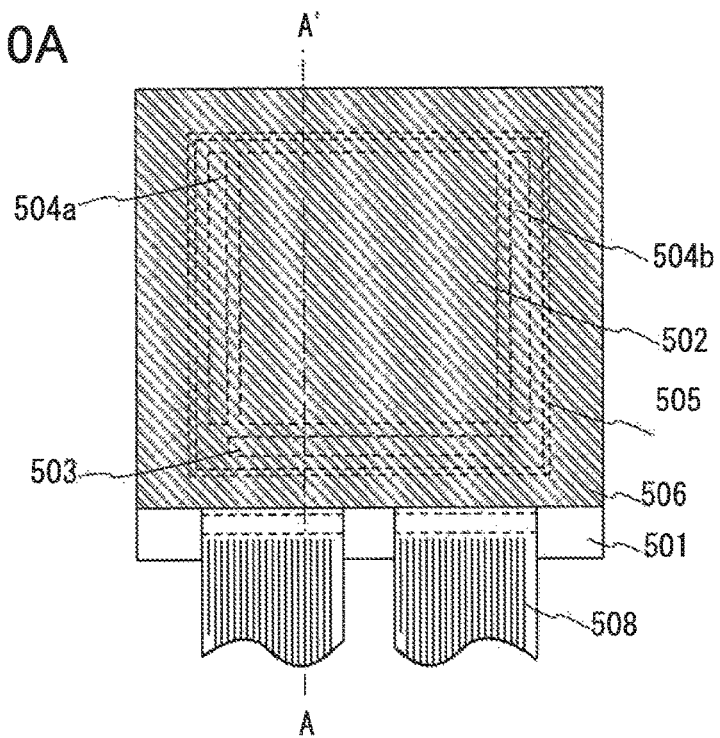
FIGS. 10A and 10B illustrate one embodiment of the present invention.
Figure 10B:
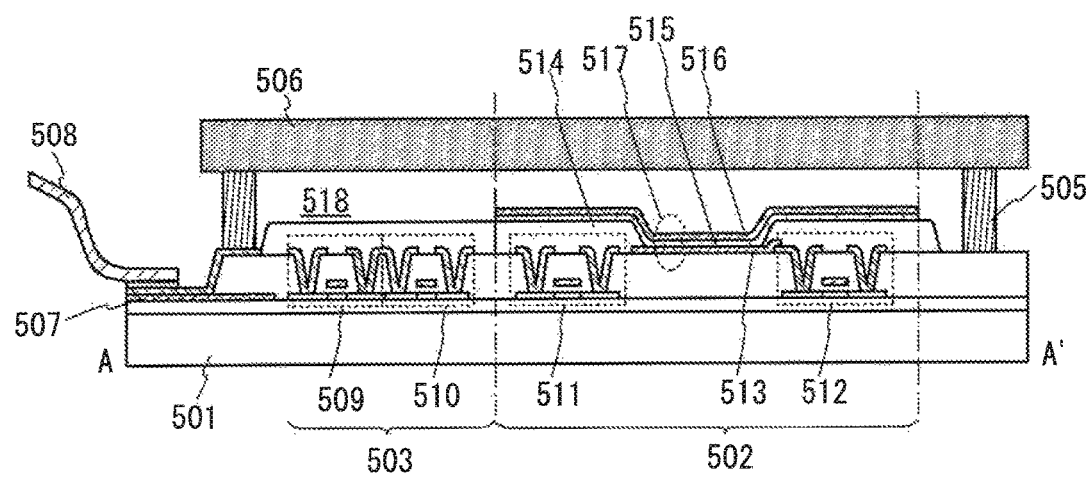

Note that FIG. 10A is a top view illustrating a light-emitting device and FIG. 10B is a cross-sectional view taken along chain line A-A' in FIG. 10A. The active matrix light-emitting device according to this embodiment includes a pixel portion 502 provided over an element substrate 501, a driver circuit portion (a source line driver circuit) 503, and driver circuit portions (gate line driver circuits) 504a and 504b. The pixel portion 502, the driver circuit portion 503, and the driver circuit portions 504a and 504b are sealed between the element substrate 501 and the sealing substrate 506 by a sealant 505.

In addition, there is provided a lead wiring 507 over the element substrate 501. The lead wiring 507 is provided for connecting an external input terminal through which a signal (e.g., a video signal, a clock signal, a start signal, and a reset signal) or a potential from the outside is transmitted to the driver circuit portion 503 and the driver circuit portions 504a and 504b. Here, an example is described in which a flexible printed circuit (FPC) 508 is provided as the external input terminal. Although only the FPC is illustrated here, a printed wiring board (PWB) may be attached to the FPC. The light-emitting device in the present specification includes, in its category, not only the light-emitting device itself but also the light-emitting device provided with the FPC or the PWB.

Next, a cross-sectional structure is explained with reference to FIG. 10B. The driver circuit portion and the pixel portion are formed over the element substrate 501; here are illustrated the driver circuit portion 503 which is the source line driver circuit and the pixel portion 502.

An example is illustrated in which a CMOS circuit which is a combination of an n-channel TFT 509 and a p-channel TFT 510 is formed as the driver circuit portion 503. Note that a circuit included in the driver circuit portion may be formed using various CMOS circuits, PMOS circuits, or NMOS circuits. Although a driver integrated type in which the driver circuit is formed over the substrate is described in this embodiment, the driver circuit may not necessarily be formed over the substrate, and the driver circuit can be formed outside, not over the substrate.

The pixel portion 502 is formed of a plurality of pixels each of which includes a switching TFT 511, a current control TFT 512, and a first electrode (anode) 513 which is electrically connected to a wiring (a source electrode or a drain electrode) of the current control TFT 512. Note that an insulator 514 is formed to cover end portions of the first electrode (anode) 513. In this embodiment, the insulator 514 is formed using a positive photosensitive acrylic resin.

In addition, in order to obtain favorable coverage by a film which is to be stacked over the insulator 514, the insulator 514 is preferably formed so as to have a curved surface with curvature at an upper edge portion or a lower edge portion. For example, in the case of using a positive photosensitive acrylic resin as a material for the insulator 514, the insulator 514 is preferably formed so as to have a curved surface with a curvature radius (0.2 µm to 3 µm) at the upper edge portion. Note that the insulator 514 can be formed using either a negative photosensitive material that becomes insoluble in an etchant by light irradiation or a positive photosensitive material that becomes soluble in an etchant by light irradiation. It is possible to use, without limitation to an organic compound, either an organic compound or an inorganic compound such as silicon oxide or silicon oxynitride.

A light-emitting element 517 is formed by stacking an EL layer 515 and a second electrode (cathode) 516 over the first electrode (anode) 513. The EL layer 515 includes at least the light-emitting layer described in Embodiment 1. Further, in the EL layer 515, a hole-injection layer, a hole-transport layer, an electron-transport layer, an electron-injection layer, a charge-generation layer, and the like can be provided as appropriate in addition to the light-emitting layer.

For the first electrode (anode) 513, the EL layer 515, and the second electrode (cathode) 516, the materials described in Embodiment 2 can be used. Although not illustrated, the second electrode (cathode) 516 is electrically connected to the FPC 508 which is the external input terminal.

In addition, although the cross-sectional view of FIG. 10B illustrates only one light-emitting element 517, a plurality of light-emitting elements are arranged in matrix in the pixel portion 502. Light-emitting elements that emit light of three kinds of colors (R, G, and B) are selectively formed in the pixel portion 502, whereby a light-emitting device capable of full color display can be obtained. Alternatively, a light-emitting device which is capable of full color display may be manufactured by a combination with color filters.

Further, the sealing substrate 506 is attached to the element substrate 501 with the sealant 505, whereby a light-emitting element 517 is provided in a space 518 surrounded by the element substrate 501, the sealing substrate 506, and the sealant 505. Note that the space 518 may be filled with an inert gas (such as nitrogen and argon) or the sealant 505.

An epoxy-based resin or glass frit is preferably used for the sealant 505. A material used for these is desirably a material which does not transmit moisture or oxygen as possible. As the sealing substrate 506, a plastic substrate formed of fiber-reinforced plastics (FRP), polyvinyl fluoride (PVF), polyester, acrylic, or the like can be used besides a glass substrate or a quartz substrate. In the case where glass frit is used as the sealant, the element substrate 501 and the sealing substrate 506 are preferably glass substrates in terms of adhesion.

As described above, an active matrix light-emitting device can be obtained.

Note that this embodiment can be combined with any of the other embodiments in this specification as appropriate.

Embodiment 7

In this embodiment, a structure example of a display device (electronic paper) which includes a display element with memory properties and which can be used as a display device of one embodiment of the present invention will be described with reference to drawings.

Figure 11A:
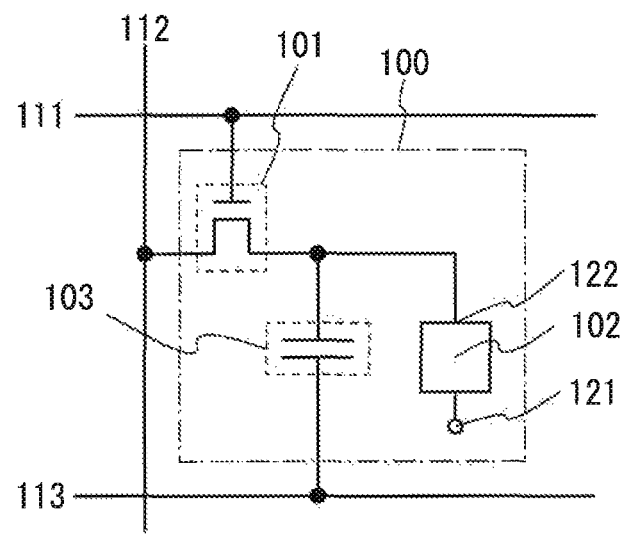
FIGS. 11A and 11B illustrate one embodiment of the present invention.

First, an example of the circuit configuration of the pixel 100 will be described with reference to FIG. 11A. The pixel 100 includes a transistor 101, a display element 102, and a capacitor 103. The display element 102 is sandwiched between a common electrode 121 and a pixel electrode 122 (also referred to as an electrode). A first terminal (one of a source electrode and a drain electrode) of the transistor 101 is electrically connected to a source signal line 112. A second terminal (the other of the source electrode and the drain electrode) of the transistor 101 is electrically connected to a pixel electrode 122. A gate of the transistor 101 is electrically connected to a gate line 111. A first electrode of the capacitor 103 is electrically connected to a capacitor line 113. A second electrode of the capacitor 103 is electrically connected to the pixel electrode 122.

The capacitor line 113 is electrically connected to the first electrodes of the capacitors 103 in the pixels 100. A predetermined voltage is applied to the capacitor line 113. The capacitor line 113 is also called a power supply line. The same voltage as that applied to the common electrode 121 or a voltage with the same value as a voltage applied to the common electrode 121, in particular, is preferably applied to the capacitor line 113. This reduces the number of the kinds of power source voltage supplied to the display device.

The common electrode 121 is also called an electrode, a counter electrode, a common electrode, or a cathode. A predetermined voltage (also called a common voltage) is supplied to the common electrode 121. Note that a voltage applied to the common electrode 121 may be varied. This reduces the amplitude voltage of an image signal, leading to a reduction in power consumption. A display element having memory properties needs a high drive voltage compared to a TN liquid crystal element which is in common use for example, thereby increasing a voltage applied to a transistor. The transistor may accordingly degrade. However it is possible to reduce a voltage applied to the transistor by varying a voltage applied to the common electrode 121 and thus reducing the amplitude voltage of an image signal as described above. This can suppress the degradation of the transistor.

Note that when a voltage applied to the common electrode 121 is varied, a voltage applied to the capacitor line 113 may be also varied at the same time. In other words, the common electrode 121 and the capacitor line 113 may be at the same or approximately the same potential. Thus, even when a voltage applied to the common electrode 121 is varied, a voltage applied to the display element 102 can remain unchanged. As a result, the gray level of the display element 102 can be maintained, preventing a decrease in display quality.

The transistor 101 is a switch having a function of controlling an electrical continuity between the source signal line 112 and the pixel electrode 122, and is also called a selecting transistor. Either an n-channel transistor or a p-channel transistor may be used as the transistor 101. When an n-channel transistor is used as the transistor 101, the transistor 101 is turned on when the gate signal is brought high, thereby selecting the pixel 100; while the transistor 101 is turned off when the gate signal is brought low, thereby deselecting the pixel 100. In contrast, when a p-channel transistor is used as the transistor 101, the transistor 101 is turned on when the gate signal is brought low, thereby selecting the pixel 100; while the transistor 101 is turned off when the gate signal is brought high, thereby deselecting the pixel 100.

Note that when an n-channel transistor is used as the transistor 101, a transistor using amorphous silicon, microcrystalline silicon, or an oxide semiconductor, an organic transistor, or the like can be used as the transistor 101. It is possible to reduce the off-state current of the transistor 101 by using a transistor using an oxide semiconductor in particular as the transistor 101, thereby allowing the capacitor 103 to be omitted or downscaled and improving the withstand voltage of the transistor 101. The withstand voltage of the transistor 101 is preferably increased because a display element with memory properties such as an electrophoretic element needs a high drive voltage.

Note that the use of a transistor using amorphous silicon, microcrystalline silicon, or an oxide semiconductor as the transistor 101 reduces the number of fabrication steps compared to the use of a transistor using polycrystalline silicon, and therefore achieves a reduction in manufacturing cost, higher yield, and/or higher reliability.

The capacitor 103 has a function of keeping the potential of the pixel electrode 122 constant, and is also called a storage capacitor. Specifically, the capacitor 103 holds a potential difference between the capacitor line 113 and the pixel electrode 122 or charge generated by this potential difference. Thus, the potential of the pixel electrode 122 can be kept constant, thereby improving display quality. Further, the time during which an image can be retained can be made longer.

Note that the first electrode of the capacitor 103 may be connected to the gate line 111 in another row (e.g., the previous row). This omits the capacitor line 113 and improves aperture ratio.

The display element 102 has memory properties. Examples of the display element 102 or the driving method of the display element 102 are the microcapsule electrophoretic method, microcup electrophoretic method, horizontal electrophoretic method, vertical electrophoretic method, twisting ball method, liquid powder method, electronic liquid powder (registered trademark) method, cholesteric liquid crystal element, chiral nematic liquid crystal element, anti-ferroelectric liquid crystal element, polymer dispersed liquid crystal element, charged toner, electrowetting method, electrochromism method, and electrodeposition method.

Figure 11B:
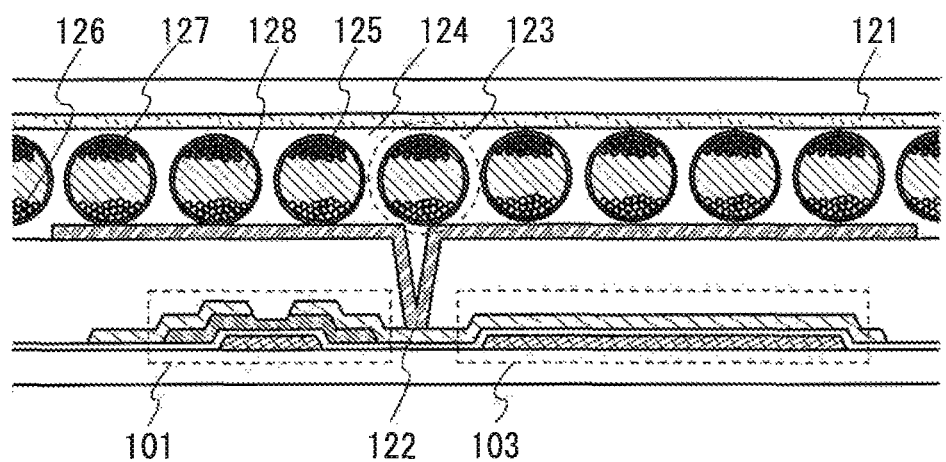

Next, an example of the cross-sectional structure of the pixel 100 that uses a display element employing a microcapsule electrophoretic method as its display element 102 will be described with reference to FIG. 11B. In the display element 102, a plurality of microcapsules 123 are placed between the common electrode 121 and the pixel electrode 122. The microcapsules 123 are fixed by a resin 124. The resin 124 functions as a binder and has light-transmitting properties. A space formed by the common electrode 121, the pixel electrode 122, and the microcapsules 123 may be filled with a gas such as air or an inert gas. In this case, a layer containing glue, adhesive, or the like is preferably formed on one or both of the common electrode 121 and the pixel electrode 122 to fix the microcapsules 123.

The microcapsule 123 includes a film 125, white particles 126 charged either positively or negatively, black particles 127 charged with the opposite polarity to that of the white particles, and dispersion liquid 128 with light-transmitting properties. The white particles 126, the black particles 127, and the dispersion liquid 128 are enclosed with the film 125.

Note that the particles enclosed with the film 125 may be blue, green, or red. Alternatively, the dispersion liquid 128 may be blue, green, red, or the like. Alternatively, both particles enclosed with the film 125 and the dispersion liquid 128 may be blue, green, red, or the like. Thus, color images can be displayed.

Note that three or more kinds of particles may be enclosed with the film 125. One kind of particles preferably has a different charge density from another.

In the above-described display element 102, the white particles 126 and the black particles 127 are moved by making a potential difference between the common electrode 121 and the pixel electrode 122. The gray level of the display element 102 is controlled by utilizing this movement of the particles. For example, the display element 102 has a lighter shade of gray (e.g., white) if the white particles 126 move to the vicinity of the common electrode 121 when seen from the common electrode 121 side. In contrast, the display element 102 has a darker shade of gray (e.g., black) if the black particles 127 move to the vicinity of the common electrode 121 when seen from the common electrode 121 side.

On the other hand, when the common electrode 121 and the pixel electrode 122 are at the same potential or when a potential difference between the common electrode 121 and the pixel electrode 122 is equal or below the threshold voltage of the display element 102, the white particles 126 and the black particles 127 stop moving. The gray level of the display element 102 can be maintained by utilizing this. For example, the lighter shade of gray of the display element 102 can be maintained by stopping the movement of the white particles 126 and the black particles 127 while the white particles 126 accumulate in the vicinity of the common electrode 121 when seen from the common electrode 121 side. In contrast, the darker shade of gray of the display element 102 can be maintained by stopping the movement of the white particles 126 and the black particles 127 while the black particles 127 accumulate in the vicinity of the common electrode 121 when seen from the common electrode 121 side.

This embodiment can be combined with any of the other embodiments in this specification as appropriate.

Embodiment 8

In this embodiment, a display module which can be formed using a display device of one embodiment of the present invention will be described with reference to FIG. 12.

I

Figure 12:
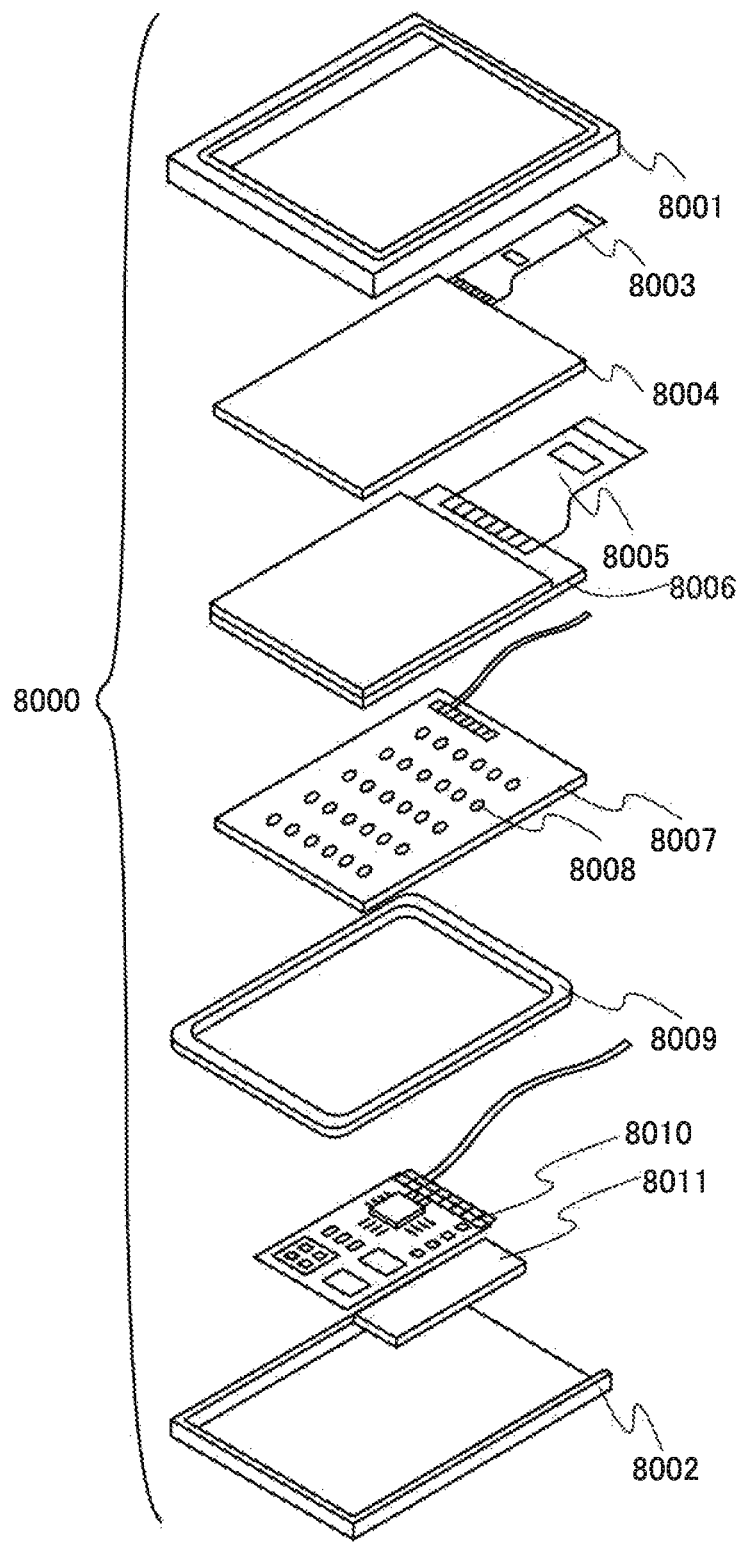
FIG. 12 illustrates one embodiment of the present invention.

In a display module 8000 in FIG. 12, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002.

J

The shapes and sizes of the upper cover 8001 and the lower cover 8002 can be changed as appropriate in accordance with the sizes of the touch panel 8004 and the display panel 8006.

K

The touch panel 8004 can be a resistive touch panel or a capacitive touch panel and can be used overlapping with the display panel 8006. A counter substrate (sealing substrate) of the display panel 8006 can have a touch panel function. A photosensor may be provided in each pixel of the display panel 8006 so that the touch panel 8004 can function as an optical touch panel.

L

The backlight unit 8007 includes a light source 8008. The light source 8008 may be provided at an end portion of the backlight unit 8007 and a light diffusing plate may be used.

M

The frame 8009 protects the display panel 8006 and also functions as an electromagnetic shield for blocking electromagnetic waves generated by the operation of the printed board 8010. The frame 8009 can function as a radiator plate.

N

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

O

The display module 8000 can be additionally provided with a member such as a polarizing plate, a retardation plate, or a prism sheet.

This embodiment can be combined with another embodiment in this specification as appropriate.

<Embodiment 9>

In this embodiment, examples of electronic devices will be described.

FIGS. 13A to 13H and FIGS. 14A to 14D illustrate electronic devices. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 13A:
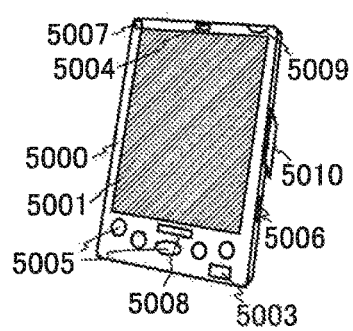
FIGS. 13A to 13H each illustrate one embodiment of the present invention.
Figure 13B:
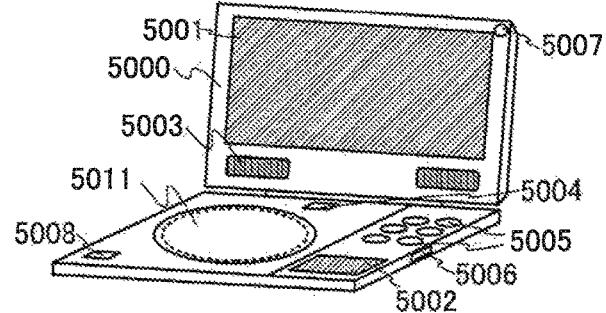
Figure 13C:
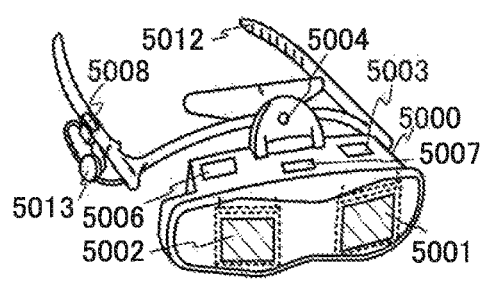
Figure 13D:
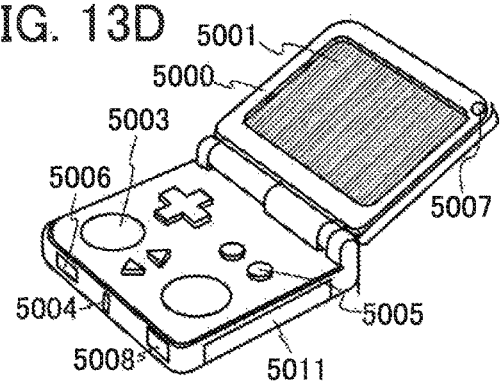
Figure 13E:
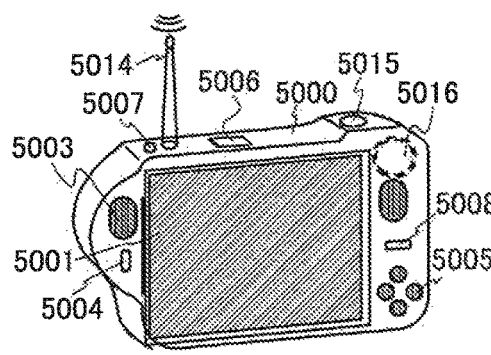
Figure 13F:
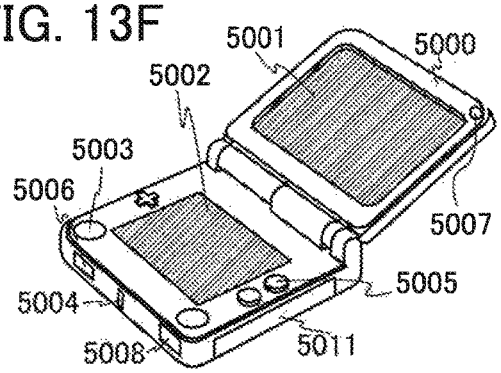
Figure 13G:
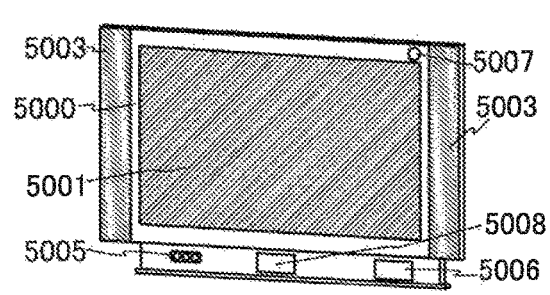
Figure 13H:
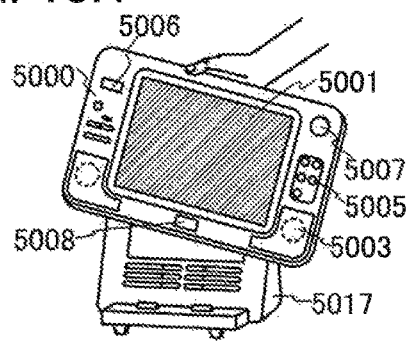
Figure 14A:
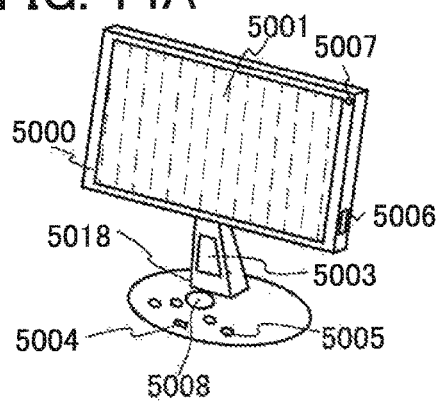
FIGS. 14A to 14H each illustrate one embodiment of the present invention.
Figure 14B:
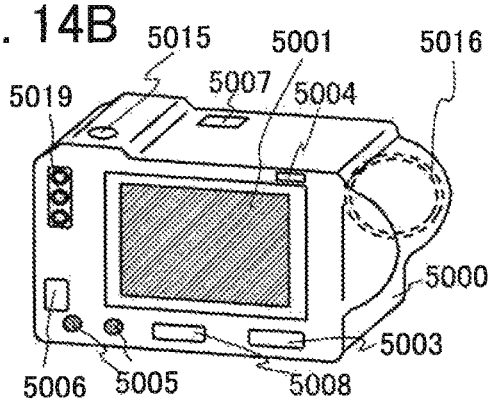
Figure 14C:
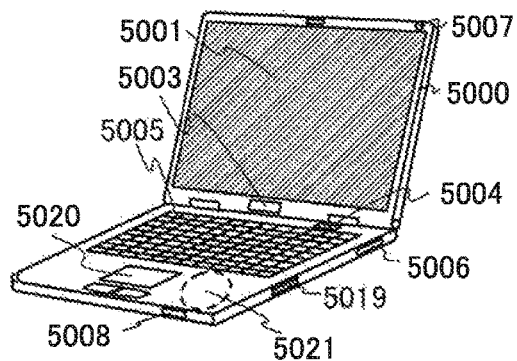
Figure 14D:
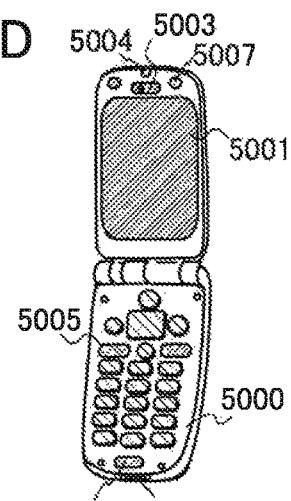

FIG. 13A illustrates a mobile computer which can include a switch 5009, an infrared port 5010, and the like in addition to the above components. FIG. 13B illustrates a portable image reproducing device (e.g., a DVD player) which is provided with a memory medium and can include a second display portion 5002, a memory medium reading portion 5011, and the like in addition to the above components. FIG. 13C illustrates a goggle-type display which can include the second display portion 5002, a supporting portion 5012, an earphone 5013, and the like in addition to the above components. FIG. 13D illustrates a portable game machine which can include the memory medium reading portion 5011 and the like in addition to the above components. FIG. 13E illustrates a digital camera which has a television reception function and can include an antenna 5014, a shutter button 5015, an image receiving portion 5016, and the like in addition to the above components. FIG. 13F illustrates a portable game machine which can include the second display portion 5002, the memory medium reading portion 5011, and the like in addition to the above components. FIG. 13G illustrates a television receiver which can include a tuner, an image processing portion, and the like in addition to the above components. FIG. 13H illustrates a portable television receiver which can include a charger 5017 capable of transmitting and receiving signals, and the like in addition to the above components. FIG. 14A illustrates a display which can include a support base 5018 and the like in addition to the above components. FIG. 14B illustrates a camera which can include an external connection port 5019, a shutter button 5015, an image reception portion 5016, and the like in addition to the above components. FIG. 14C illustrates a computer which can include a pointing device 5020, the external connection port 5019, a reader/writer 5021, and the like in addition to the above components. FIG. 14D illustrates a mobile phone which can include a transmitter, a receiver, a tuner of one-segment partial reception service for mobile phones and mobile terminals, and the like in addition to the above components.

The electronic devices illustrated in FIGS. 13A to 13H and FIGS. 14A to 14D can have a variety of functions. For example, a function of displaying a variety of data (a still image, a moving image, a text image, and the like) on a display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on a display portion, and the like can be given. Further, the electronic device including a plurality of display portions can have a function of displaying image data mainly on one display portion while displaying text data on another display portion, a function of displaying a three-dimensional image by displaying images on a plurality of display portions with a parallax taken into account, or the like. Furthermore, the electronic device including an image receiving portion can have a function of shooting a still image, a function of taking a moving image, a function of automatically or manually correcting a shot image, a function of storing a shot image in a memory medium (an external memory medium or a memory medium incorporated in the camera), a function of displaying a shot image on the display portion, or the like. Note that functions that can be provided for the electronic devices illustrated in FIGS. 13A to 13H and FIGS. 14A to 14D are not limited thereto, and the electronic devices can have a variety of functions.

The electronic devices described in this embodiment each include the display portion for displaying some sort of data.

Next, applications of a display device will be described.

Figure 14E:
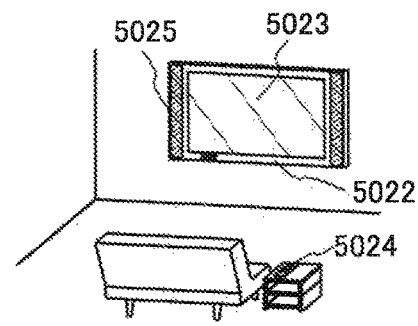

FIG. 14E illustrates an example in which a display device is incorporated in a building. FIG. 14E illustrates a housing 5022, a display portion 5023, a remote controller 5024, which is an operation portion, a speaker 5025, and the like. The display device is incorporated in the building as a wall-hanging type, so that the display device can be provided without requiring a wide space.

Figure 14F:
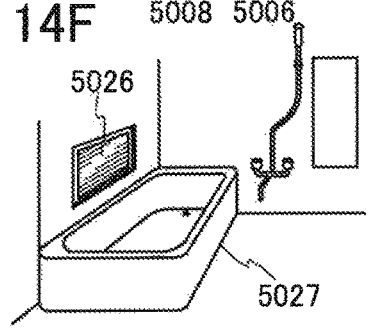

FIG. 14F illustrates another example in which a display device is incorporated in a building. The display module 5026 is incorporated in a prefabricated bath 5027 so that a bather can watch the display module 5026.

Note that although the wall and the prefabricated bath are taken as examples of the building in this embodiment, one embodiment of the present invention is not limited thereto and a display device can be provided in any of a variety of buildings.

AA

Next, an example in which a display device is incorporated in a moving object will be described.

BB

Figure 14G:
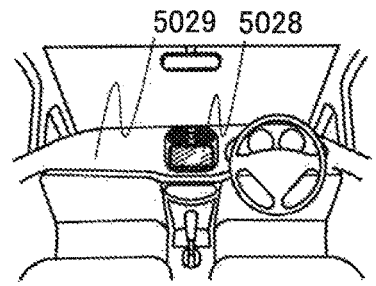

FIG. 14G illustrates an example in which a display device is provided in a vehicle. A display module 5028 is provided in a body 5029 of a vehicle and can display data on the operation of the body or data input from inside or outside of the body on demand. Note that a navigation function may be provided.

CC

Figure 14H:
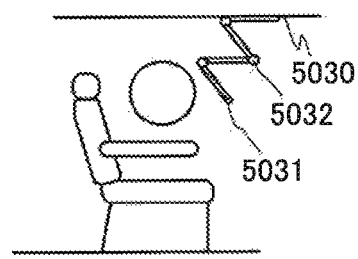

FIG. 14H illustrates an example in which a display device is incorporated in a passenger airplane. FIG. 14H illustrates a usage pattern when a display module 5031 is provided for a ceiling 5030 above a seat of the passenger airplane. The display module 5031 is attached to the ceiling 5030 with a hinge portion 5032, and a passenger can watch the display module 5031 by stretching the hinge portion 5032. The display module 5031 has a function of displaying data when operated by a passenger.

DD

Note that although the body of the vehicle and the body of the airplane are taken as examples of the moving object, one embodiment of the present invention is not limited thereto. A display device can be provided for a variety of moving objects such as a two-wheel vehicle, a four-wheel vehicle (including an automobile and a bus), a train (including a monorail train and a railway train), and a ship.

This embodiment can be combined with any of the other embodiments in this specification as appropriate.

Example

Figure 5:
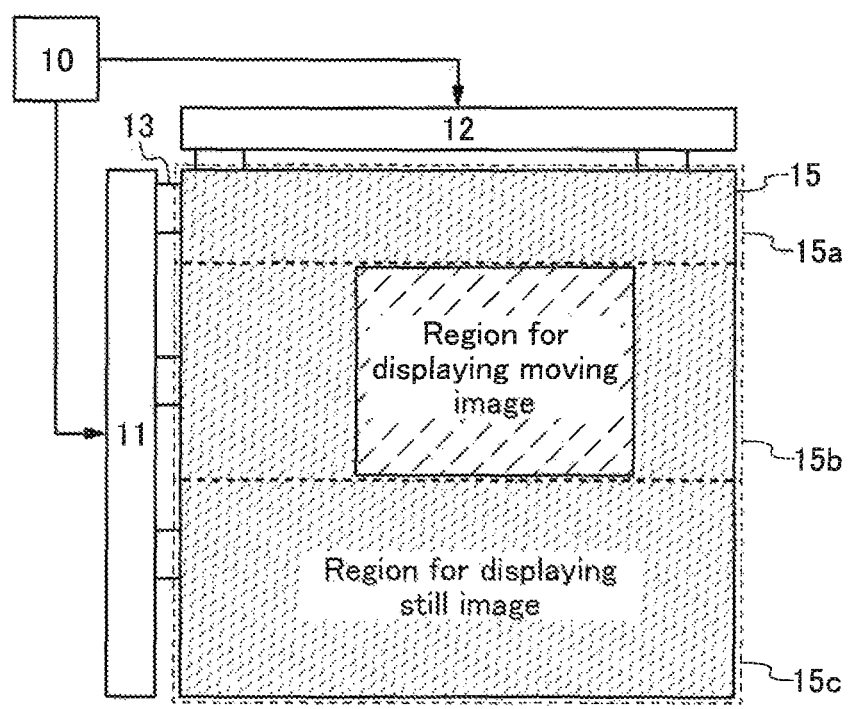
FIG. 5 illustrates an example of the present invention.

An example of embodiments of the present invention will be described below with reference to FIG. 5. FIG. 5 is a schematic diagram showing the case where a moving image is displayed in part of the display device in FIG. 1 and a still image is displayed in the other part of the display device. Reference numeral 15b in FIG. 5 indicates a region including a row having a pixel used for displaying a moving image. Reference numerals 15a and 15c in FIG. 5 indicate regions not including a pixel used for displaying the moving image.

In Example, the invention described above can be carried out in the regions 15a and 15c. This enables the power consumption of the display device to be reduced. In the region 15b, operation is performed so as to sequentially select rows one by one. That is, in a row including a region for displaying the moving image, video signals are input at a predetermined cycle to rewrite images. Retention periods for video signals in pixels in the frame periods (or the subframe periods) are equal. In the case where a display device (a display device in which transistors containing an oxide semiconductor is provided in pixels) similar to the display device disclosed in Patent Document 1 (Japanese Published Patent Application No. 2011-141523) is used as the display device, the rewriting frequency (frame rate) in the regions 15a and 15b can be reduced. Thus, power consumption of the display device can be further reduced.

This application is based on Japanese Patent Application serial no. 2013-069385 filed with Japan Patent Office on Mar. 28, 2013, the entire contents of which are hereby incorporated by reference.

What is claimed is:

1. A display device comprising:
    a pixel portion comprising a first region having first pixels for displaying a still image and a second region having second pixels for displaying a moving image;
    a first signal line electrically connected to the first pixels; and
    a second signal line electrically connected to the second pixels,
    wherein the first signal line is configured to be supplied with a plurality of video signals to the first pixels in a first frame period so that potentials of the plurality of video signals are gradually increased or decreased,
    wherein a period from an end of the first frame period to a start of a next frame period is six times or more than the first frame period, and
    wherein the second signal line is configured to be sequentially supplied with a plurality of video signals to the second pixels in an arranging order of the second pixels.

2. The display device according to claim 1, wherein the second signal line is further electrically connected to at least one of the first pixels in the first region.

3. The display device according to claim 1, wherein each of the first pixels has a transistor containing an oxide semiconductor layer including a channel formation region.

4. A display device comprising:
    a pixel portion comprising a first region having first pixels for displaying a still image and a second region having second pixels for displaying a moving image;
    a first signal line electrically connected to the first pixels; and
    a second signal line electrically connected to the second pixels,
    wherein the first signal line is configured to be supplied with a plurality of video signals to the first pixels in a first frame period so that potentials of the plurality of video signals are varied in one of ascending order and descending order,
    wherein a period from an end of the first frame period to a start of a next frame period is six times or more than the first frame period, and
    wherein the second signal line is configured to be sequentially supplied with a plurality of video signals to the second pixels in an arranging order of the second pixels.

5. The display device according to claim 4, wherein the second signal line is further electrically connected to at least one of the first pixels in the first region.

6. The display device according to claim 4, wherein each of the first pixels has a transistor containing an oxide semiconductor layer including a channel formation region.

7. A display device comprising:
    a pixel portion comprising a first region having first pixels for displaying a still image and a second region having second pixels for displaying a moving image;
    a first signal line electrically connected to the first pixels;
    a second signal line electrically connected to the second pixels; and
    a first circuit configured to arrange a plurality of video signals so that potentials of the plurality of video signals supplied to the first pixels are sorted in one of ascending order and descending order in a first frame period, wherein a period from an end of the first frame period to a start of a next frame period is six times or more than the first frame period, and wherein the second signal line is configured to be sequentially supplied with a plurality of video signals to the second pixels in an arranging order of the second pixels.

8. The display device according to claim 7, further comprising:

a second circuit electrically connected to the first signal line and the second signal line; and a third circuit configured to supply selection signals to the pixel portion.

9. The display device according to claim 7, wherein the second signal line is further electrically connected to at least one of the first pixels in the first region.

10. The display device according to claim 7, wherein each of the first pixels has a transistor containing an oxide semiconductor layer including a channel formation region.

* * * * *